(12) United States Patent
Chang

(10) Patent No.: US 10,163,937 B2
(45) Date of Patent: Dec. 25, 2018

(54) PIXEL STRUCTURE AND FABRICATING METHOD THEREOF

(71) Applicant: Au Optronics Corporation, Hsinchu (TW)

(72) Inventor: Chi-Ho Chang, New Taipei (TW)

(73) Assignee: Au Optronics Corporation, Hsinchu (TW)

( * ) Notice: Subject to any disclaimer, the term of this patent is extended or adjusted under 35 U.S.C. 154(b) by 6 days.

(21) Appl. No.: 15/423,587

(22) Filed: Feb. 3, 2017

(65) Prior Publication Data

US 2017/0229483 A1 Aug. 10, 2017

(30) Foreign Application Priority Data

Feb. 5, 2016 (TW) .............................. 105103948 A

(51) Int. Cl.
*H01L 27/12* (2006.01)
*H01L 29/786* (2006.01)

(52) U.S. Cl.
CPC ........ *H01L 27/124* (2013.01); *H01L 27/1262* (2013.01); *H01L 29/78642* (2013.01)

(58) Field of Classification Search
CPC ............... H01L 27/124; H01L 27/1262; H01L 29/78642
USPC ......................................................... 257/72
See application file for complete search history.

(56) References Cited

U.S. PATENT DOCUMENTS

| 5,441,905 A | 8/1995 | Wu |
| 5,532,180 A | 7/1996 | Den Boer et al. |
| 5,818,550 A | 10/1998 | Kadota et al. |
| 8,105,954 B2 | 1/2012 | Wang et al. |
| 2012/0074416 A1* | 3/2012 | Kim ..................... G02F 1/13624 257/59 |
| 2012/0105787 A1* | 5/2012 | Gotoh ................... G02F 1/1368 349/139 |
| 2015/0277199 A1* | 10/2015 | Chang ............... G02F 1/136286 349/12 |

FOREIGN PATENT DOCUMENTS

CN 103984130 A * 8/2014 ....... G02F 1/136286

* cited by examiner

*Primary Examiner* — Moazzam Hossain
*Assistant Examiner* — Warren H Kilpatrick
(74) *Attorney, Agent, or Firm* — JCIPRNET

(57) ABSTRACT

A pixel structure includes a scan line, a data line, a bump, an active device, and a pixel electrode electrically connected to the active device. The active device includes a gate, a semiconductor layer, a gate insulation layer between the gate and the semiconductor layer, a source, and a drain. The bump has a top surface and side surfaces in periphery of the top surface. The gate covers the bump and electrically connects the scan line. The semiconductor layer is on the top surface and the side surfaces. The source is on at least one of the side surfaces, in contact with the semiconductor layer, and electrically connected to the data line. The drain is on the top surface and in contact with the semiconductor layer, and the drain does not cover the semiconductor layer on a corner section of the bump between the top surface and the side surfaces.

20 Claims, 17 Drawing Sheets

PIXEL STRUCTURE AND FABRICATING METHOD THEREOF

CROSS-REFERENCE TO RELATED APPLICATION

This application claims the priority benefit of Taiwan application serial no. 105103948, filed on Feb. 5, 2016. The entirety of the above-mentioned patent application is hereby incorporated by reference herein and made a part of this specification.

BACKGROUND OF THE DISCLOSURE

Field of the Disclosure

The disclosure relates to a pixel structure and a fabricating method thereof.

Description of Related Art

In various flat panel displays, thin film transistor liquid crystal displays (TFT-LCDs) are very popular due to the advantages of high space utilization rate, low power consumption, non-radiation, low electromagnetic interference, and so forth. The TFT-LCD is generally composed of an active array substrate, a color filter substrate, and a liquid crystal layer sandwiched between the two substrates. The active array substrate has an active region and a peripheral circuit region. The active array is located within the active region, and the driving circuit is located within the peripheral circuit region.

In the active array of the active region, for instance, thin film transistors (TFTs) with a high channel width-to-length (W/L) ratio are often used. In general, a turned-on current ($I_{on}$) of the TFT is in direct proportion to the W/L ratio and satisfies the following equation: $I_{on}=U*W/L*(V_G-V_{th})*V_D$, where U is carrier mobility, W is channel width, L is channel length, $V_G$ is gate voltage, $V_{th}$ is threshold voltage, and $V_D$ is drain voltage. It can be derived from the above equation that the turned-on current ($I_{on}$) can be increased by increasing the W/L ratio. However, subject to the feasible exposure and development techniques at present, the channel length can be merely reduced to approximately 3.5 μm.

To effectively increase the W/L ratio, the conventional issue provided above may be alternatively resolved by increasing the channel width. Nevertheless, the increase in the channel width often leads to the significant increase in the layout area of the device, which results in the loss of the aperture ratio.

SUMMARY OF THE DISCLOSURE

The disclosure provides a pixel structure whose aperture ratio can be raised together with an increase in the W/L ratio of the pixel structure.

In an embodiment of the disclosure, a pixel structure that includes a scan line, a data line, a bump, an active device, and a pixel electrode is provided. The scan line and the data line are located on a substrate. The active device is located on the substrate and includes a gate, a semiconductor layer, a gate insulation layer, a source, and a drain. The bump is located on the substrate and has a top surface and a plurality of side surfaces located in periphery of the top surface. The gate covers the bump and is electrically connected to the scan line. The semiconductor layer is located on the top surface and the side surfaces of the bump. The gate insulation layer is located between the gate and the semiconductor layer. The source is located on at least one of the side surfaces of the bump, and the source is in contact with the semiconductor layer and electrically connected to the data line. The drain is located on the top surface of the bump and is in contact with the semiconductor layer, and the drain does not cover the semiconductor layer located on a corner section of the bump between the top surface and the side surfaces. The pixel electrode is electrically connected to the drain of the active device.

In an embodiment of the disclosure, a fabricating method of a pixel structure is provided, and the fabricating method includes following steps. A bump is formed on a substrate, and the bump has a top surface and a plurality of side surfaces located in periphery of the top surface. A gate is formed on the bump, and a scan line connected to the gate is formed on the substrate. A semiconductor layer is formed on the top surface and the side surfaces of the bump. A gate insulation layer is formed between the gate and the semiconductor layer. A conductive layer is formed on the bump. A patterned photoresist layer is formed on the conductive layer, wherein the thickness of the patterned photoresist layer is less than the height of the bump. The conductive layer is patterned with use of the patterned photoresist layer as an etching mask, so as to form a drain on the top surface of the bump, wherein the drain does not cover the semiconductor layer located on a corner section of the bump between the top surface and the side surfaces. A source and a data line connected to the source are formed in periphery of the bump and on the substrate, and the source partially covers the side surfaces of the bump. A pixel electrode is formed, and the pixel electrode is electrically connected to the drain.

Based on the above, the pixel structure provided herein has the bump arranged on the substrate. Due to the special outer profile of the bump, the photoresist material disposed above the bump can be automatically separated into two portions, so as to form the patterned photoresist layer. Thereby, the W/L ratio of the pixel structure can be increased on the condition that the aperture ratio of the pixel structure is increased or is at least not reduced.

Several exemplary embodiments accompanied with figures are described in detail below to further describe the disclosure in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
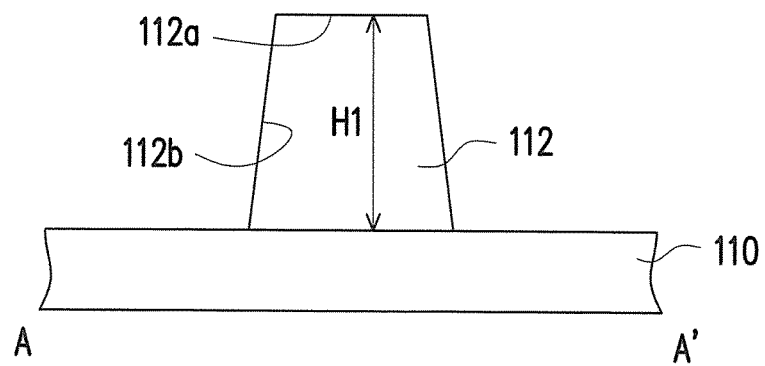
FIG. 1A to FIG. 1H are cross-sectional flowcharts of a fabricating method of a pixel structure according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts. Further, the term "connect" or "electrically connected," as used herein, refers to the direct or indirect physical or electrical contact between or among two or more components, or the mutual operation or action of two or more components.

FIG. 1A to FIG. 1H are cross-sectional flowcharts of a fabricating method of a pixel structure according to an embodiment of the disclosure. Specifically, FIG. 1A to FIG. 1H are taken along a sectional line AA' in FIG. 2A or FIG. 2B. FIG. 2A is a schematic top view illustrating the pixel structure depicted in FIG. 1H. FIG. 2B is a schematic top view illustrating the pixel structure depicted in FIG. 1H according to another embodiment of the disclosure. As shown in FIG. 1A, a substrate 110 is provided. The substrate 110 is made of glass, quartz, organic polymer, an opaque/reflective material (e.g., a conductive material, metal, wafer, ceramics, or any other appropriate material), or any other appropriate material. If the substrate 110 is made of the conductive material or metal, the substrate 110 is covered by an insulation layer (not shown) to prevent short circuit. A bump 112 is formed on the substrate 110, and the bump 112 has a top surface 112a and a plurality of side surfaces 112b located in periphery of the top surface 112a. Besides, the bump 112 has a height H1. The height H1 is within a range from about 1 μm to about 5 μm, preferably from about 2 μm to about 4 μm; however, the disclosure should not be limited thereto. In the present embodiment, the bump 112 is formed by depositing a bump material layer (not shown) and patterning the bump material layer. Said patterning process includes, for instance, a photolithography process and an etching process; however, the disclosure should not be limited to the embodiment set forth herein. The material of the bump 112 includes an inorganic material (e.g., silicon oxide, silicon nitride, silicon oxynitride, any other appropriate material, or a stacked layer containing at least two of the above-mentioned materials), an organic material, a conductive material, a non-conductive material, any other appropriate material, or a combination thereof.

Figure 1B:
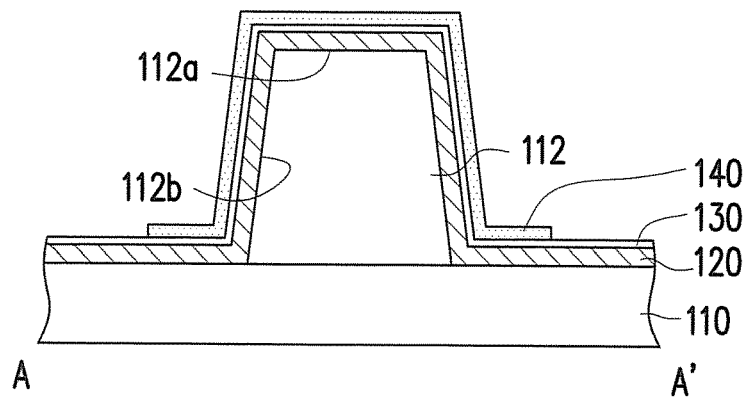
Figure 2A:
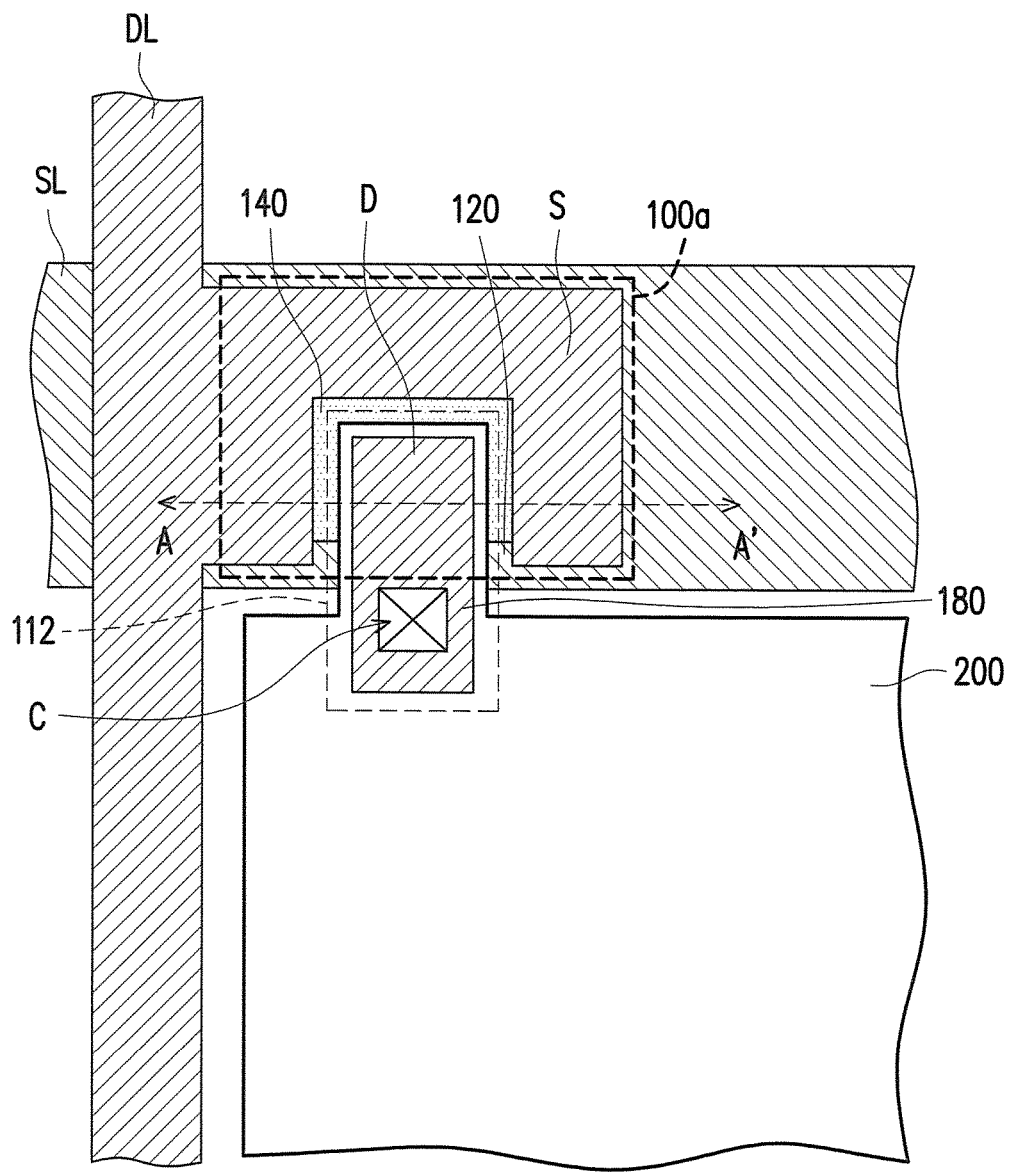
FIG. 2A is a schematic top view illustrating the pixel structure depicted in FIG. 1H.
Figure 2B:
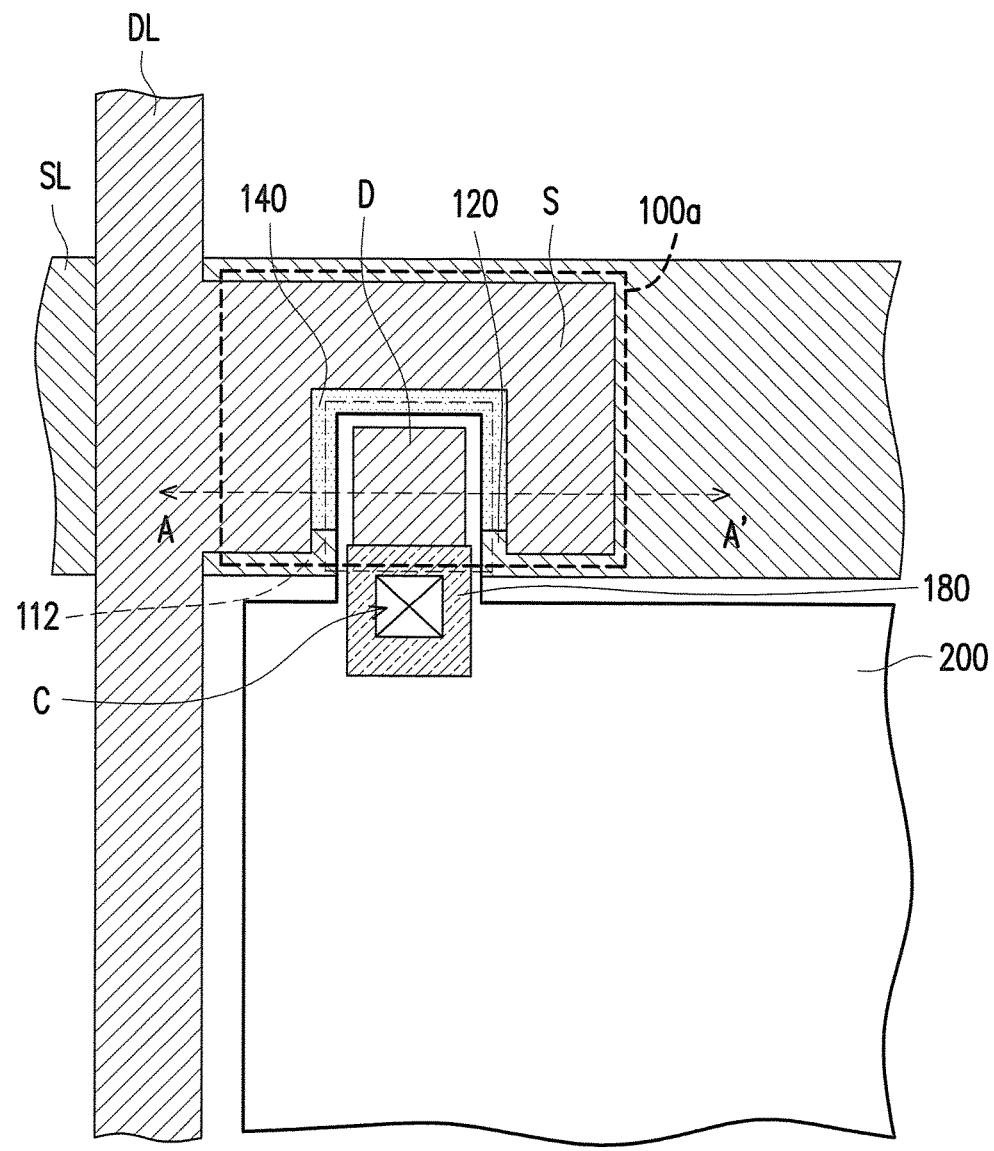
FIG. 2B is a schematic top view illustrating the pixel structure depicted in FIG. 1H according to another embodiment of the disclosure.

With reference to FIG. 1B and FIG. 2A, a gate 120 and a scan line SL, a gate insulation layer 130, and a semiconductor layer 140 are sequentially formed on the substrate 110 and the bump 112. The gate 120 is located above the top surface 112a and the side surfaces 112b of the bump 112, and the gate 120 and the scan line SL are connected to each other (as shown in FIG. 2A). The gate insulation layer 130 is located between the gate 120 and the semiconductor layer 140 and covers the gate 120 and the scan line SL. The semiconductor layer 140 is located on the top surface 112a and the side surfaces 112b of the bump 112 and is further extended to the substrate 110 from the side surfaces 112b of the bump 112, so that the semiconductor layer 140 partially covers the gate insulation layer 130 above the bump 112 and the substrate 110. To form the gate 120, the scan line SL, the gate insulation layer 130, and the semiconductors layer 140, a first metal layer (not shown) is formed on the substrate 110 and the bump 112 and patterned to form the gate 120 and the scan line SL connected to the gate 120. A gate insulation material layer is deposited onto the substrate 110 to form the gate insulation layer 130 that covers the gate 120 and the scan line SL. A semiconductor material layer (not shown) is then deposited onto the substrate 110 and is patterned, so as to form the semiconductor layer 140 partially on the gate insulation layer 130 that is located above the top surface 112a and the side surfaces 112b of the bump 112 and partially on the gate insulation layer 130 that is located above the substrate 110. Said patterning process includes, for instance, a photolithography process and an etching process; however, the disclosure should not be limited to the embodiment set forth herein. It should be mentioned that the process of patterning the semiconductor layer 140 can be performed together with the subsequent process of forming the conductive layer 150, which will be elaborated hereinafter.

The material of the gate 120 and the material of the scan line SL include metal, metal oxide, an organic conductive material, or a combination thereof. The material of the gate insulation layer 130 includes an inorganic material (e.g., silicon oxide, silicon nitride, silicon oxynitride, any other appropriate material, or a stacked layer containing at least two of the above-mentioned materials), an organic material, any other appropriate material, or a combination thereof. The material of the semiconductor layer 140 includes a metal oxide semiconductor material (e.g., indium-gallium-zinc oxide (IGZO), zinc oxide (ZnO), tin oxide (SnO), indium-zinc oxide (IZO), gallium-zinc oxide (GZO), zinc-tin oxide (ZTO), or indium-tin oxide (ITO)) or an amorphous silicon material, any other appropriate material, or a combination thereof. In the present embodiment, each of the gate 120, the gate insulation layer 130, and the semiconductor layer 140 has the single-layer structure, which should however not be construed as a limitation in the disclosure. In other embodiments, the gate 120, the gate insulation layer 130, and the semiconductor layer 140 may have a double-layer structure or a multi-layer structure.

Figure 1C:
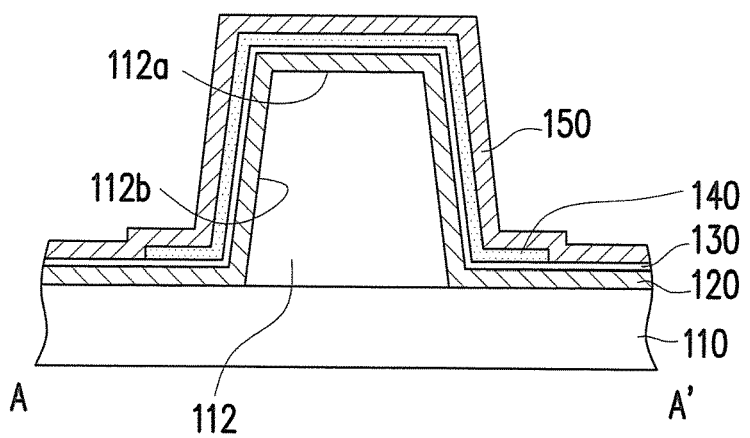

With reference to FIG. 1C, a conductive layer 150 is formed above the substrate 110, so as to cover the gate insulation layer 130 and the semiconductor layer 140. In consideration of conductivity, the material of the conductive layer 150 is metal, metal oxide, an organic conductive material, or a combination thereof, for instance. However, the disclosure should not be limited thereto.

Figure 1D:
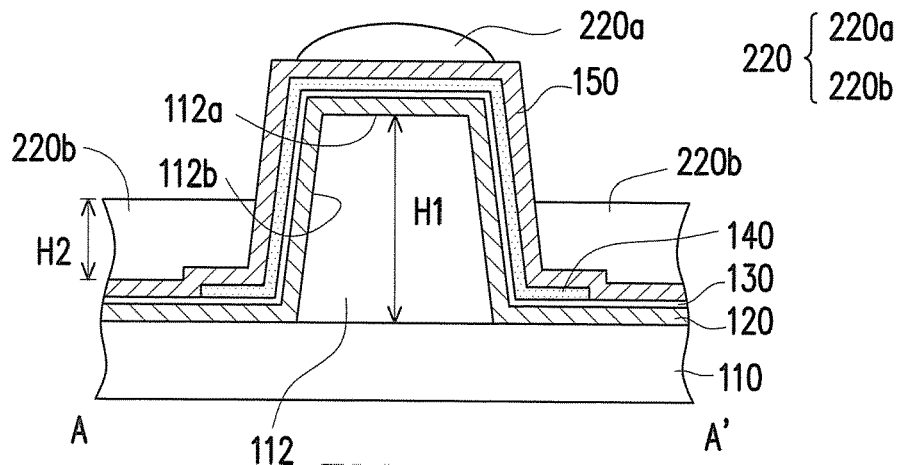

Then, a patterned photoresist layer 220 is formed on the conductive layer 150. The patterned photoresist layer 220 includes a first photoresist portion 220a and a second photoresist portion 220b, and a thickness H2 of the patterned photoresist layer 220 is less than the height H1 of the bump 112 as shown in FIG. 1D. A method of forming the patterned photoresist layer 220 includes a step of coating the substrate 110 with a photoresist material. For instance, the substrate 110 is coated with a photoresist material (not shown) having the thickness less than the height of the bump 112, and due to the protruding profile of the bump 112, the photoresist material on the top surface 112a of the bump 112 is automatically separated from the photoresist material on the side surfaces 112b of the bump 112 and on the substrate 110. A curing step is performed on the photoresist material, so as to cure the photoresist material on the top surface 112a of the bump 112 and the photoresist material on the side surfaces 112b of the bump 112 and the substrate 110, and respectively form the first photoresist portion 220a and the second photoresist portion 220b that together constitute the patterned photoresist layer 220. The material of the patterned photoresist layer 220 is, for instance, a positive photoresist material or a negative photoresist material, which should not be construed as a limitation in the disclosure. Note that the method of forming the patterned photoresist layer 220 does not include any exposure process and development process. Besides, after the photoresist material on the top surface 112a of the bump 112 is automatically separated from the photoresist material on the side surfaces 112b of the bump 112 and the substrate 110, some photoresist material may be left at a corner section due to variations in the fabricating process. At this time, the separation of the photoresist material can be completely done through plasma treatment, asking treatment, and so on; thereby, the photoresist material on the top surface 112a of the bump 112 is completely separated from the photoresist material on the side surfaces 112b of the bump 112 and the substrate 110, so as to respectively constitute the first photoresist portion 220a and the second photoresist portion 220b.

Figure 1E:
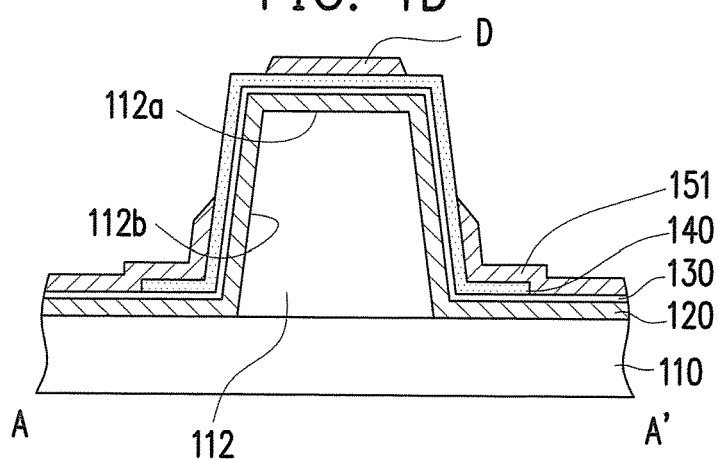

With reference to FIG. 1E, a first patterning process is performed on the conductive layer 150 with use of the patterned photoresist material 220 as an etching mask, so as to form a drain D and a patterned conductive layer 151, and the patterned photoresist layer 220 is then removed. The drain D is in contact with the semiconductor layer 140. Here, the drain D is located on the top surface 112a of the bump 112 but neither covers the semiconductor layer 140 on the side surfaces 112b of the bump 112 nor covers the semiconductor layer 140 located on a corner section of the bump 112 between the top surface 112a and the side surfaces 112b, and the patterned conductive layer 151 covers parts of the semiconductor layer 140 on the side surfaces 112b of the bump 112. Said patterning process is, for instance, an etching process; however, the disclosure should not be limited to the embodiment set forth herein.

Figure 1F:
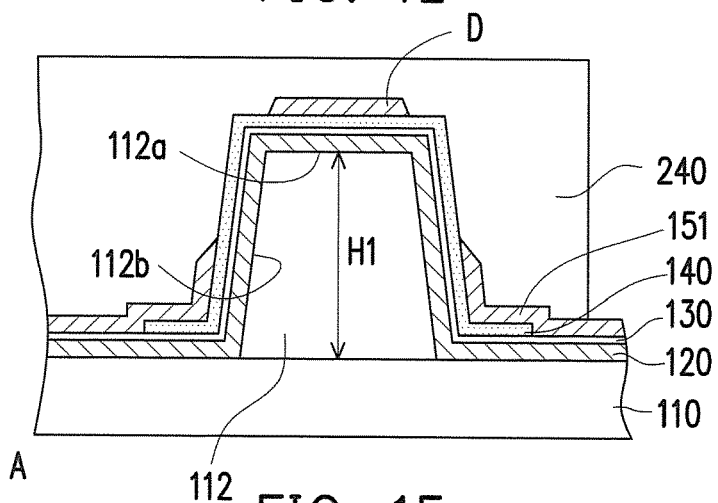
Figure 1G:
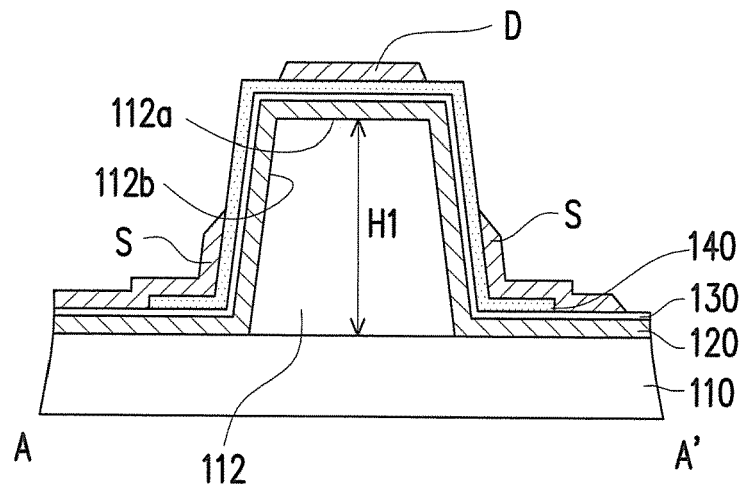

A patterned photoresist layer 240 is formed on the substrate 110, as shown in FIG. 1F. With reference to FIG. 1G and FIG. 2A, a second patterning process is performed on the patterned metal layer 151 with use of the patterned photoresist layer 240 as an etching mask, so as to form a source S in periphery of the bump 112 and a data line DL, and the patterned photoresist layer 240 is then removed. The source S is located on at least one of the side surfaces 112b of the bump 112 and extended to the substrate 110 from the at least one of the side surfaces 112b of the bump 112, and the source S is in contact with the semiconductor layer 140. Besides, the source S does not cover the semiconductor layer 140 located on the corner section of the bump 112 between the top surface 112a and the side surfaces 112b of the bump 112. That is, the source S partially covers at least one side surface 112b of the bump 112 but does not cover the top surface 112a of the bump 112. Besides, the source S and the data line DL are connected to each other, as shown in FIG. 2A.

In the present embodiment, the source S is shaped as a letter U, which should however not be construed as a limitation in the disclosure; in another embodiment, the source S may be shaped as a letter I or a letter L, for instance. The material of the patterned photoresist layer is, for instance, a positive photoresist material or a negative photoresist material, and the patterning process includes, for instance, a photolithography process and an etching process, which should not be construed as limitations in the disclosure. That is, the patterned photoresist layer 220 acting as the etching mask for performing the patterning process on the metal layer 150 is applied to define the boundary between the source S and the drain D. Up to here, the fabrication of the active device 100a in the present embodiment is completed. In the present embodiment, the active device 100a is, for instance, a bottom-gate TFT, which should however not be construed as a limitation in the disclosure. In another embodiment, the active device 100a may also be a top-gate TFT.

Figure 1H:
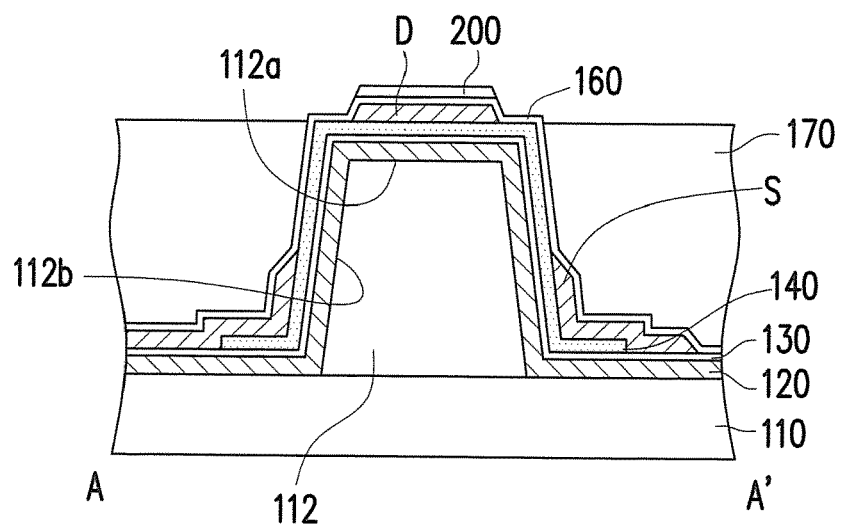

With reference to FIG. 1H and FIG. 2A, a passivation layer 160, a planarization layer 170, and a pixel electrode 200 are sequentially formed on the active device 100a, and the pixel electrode 200 is electrically connected to the drain D of the active device 100a. Specifically, in the present embodiment, before the passivation layer 160, the planarization layer 170, and the pixel electrode 200 are formed, a connection portion 180 is also formed or defined at the time of forming the drain D. Particularly, the drain D and the connection portion 180 that is connected to the drain D are located on the top surface 112a of the bump 112 but neither cover the side surfaces 112b of the bump 112 nor cover the semiconductor layer 140 located on the corner section of the bump 112 between the top surface 112a and the side surfaces 112b. The drain D is arranged corresponding to the gate 120, and the connection portion 180 is not overlapped with the gate 120, as shown in FIG. 2A. One end of the connection portion 180 is connected to the drain D and is located on the semiconductor layer 140, and the connection portion 180 is extended toward the pixel electrode 200 along the top surface 112a of the bump 112. That is, the connection portion 180 is extended toward the pixel electrode 200 from the drain D for connecting the drain D and the pixel electrode 200.

However, the disclosure is not limited thereto; in another embodiment, the connection portion 180 connected to the drain D and the drain D may belong to two different film layers, as shown in FIG. 2B, and the connection portion 180 and the drain D may be respectively formed by performing two patterning processes, for instance. The connection portion 180 is located on at least one side surface 112b of the bump 112 and covers the top surface 112a of the bump 112. One end of the connection portion 180 is connected to the drain D, and the other end of the connection portion 180 is extended toward and connected to the pixel electrode 200 along at least one side surface 112b of the bump 112. Accordingly, the connection portion 180 is extended toward the pixel electrode 200 from the drain D for connecting the drain D and the pixel electrode 200.

As provided above, the passivation layer 160 is formed on the active device 100a after the source S, the drain D, and the connection portion 180 connected to the drain D are formed. The passivation layer 160 covers the source S, the drain D, and the connection portion 180. The planarization layer 170 is formed on the passivation layer 160, and the planarization layer 170 covers the drain D and the connection portion 180. A patterning process is performed on the planarization layer 170 and the passivation layer 160, so as to form a contact window C exposing or uncovering the connection portion 180. The pixel electrode 200 is then formed on the passivation layer 160 and the planarization layer 170. The pixel electrode 200 is located above the drain D and the connection portion 180, such that the pixel electrode 200 is connected to the connection portion 180 through the contact window C in the planarization layer 170 and the passivation layer 160. That is, the pixel electrode 200 is electrically connected to the drain D of the active device 100a through the contact window C. However, the disclosure is not limited to the embodiment provided herein, in another embodiment, the pixel electrode 200 may be located above the connection portion 180 and is not overlapped with the drain D.

The material of the passivation layer 160 includes an inorganic material (e.g., silicon oxide, silicon nitride, silicon oxynitride, any other appropriate material, or a stacked layer containing at least two of the above-mentioned materials), an organic material, any other appropriate material, or a combination thereof. The material of the planarization layer 170 includes an inorganic material (e.g., silicon oxide, silicon nitride, silicon oxynitride, siloxane, any other appropriate material, or a stacked layer containing at least two of the above-mentioned materials), an organic material (e.g., polyester (PET), polyolefin, polypropylene, polycarbonate, polyalkylene oxide, polystyrene, polyether, polyketone, polyalcohol, polyaldehyde, any other appropriate material, or a combination thereof), any other appropriate material, or a combination thereof. The pixel electrode 200 may be a transmissive pixel electrode, a reflective pixel electrode, or a transflective pixel electrode. The material of the transmissive pixel electrode includes metal oxide, such as ITO, IZO, ATO, AZO, IGZO, any other appropriate oxide, or a stacked layer containing at least two of the above. The material of the reflective pixel electrode includes a metal material with high reflectivity. Up to here, the fabrication of the pixel structure provided in the present embodiment is completed.

With reference to FIG. 1H and FIG. 2A, structurally speaking, the pixel structure provided in the present embodiment has the scan line SL, the data line DL, the bump 112, the active device 100a, and the pixel electrode 200. The active device 100a includes the gate 120, the gate insulation layer 130, the semiconductor layer 140, the source S, and the drain D. In the present embodiment, the pixel structure further includes the passivation layer 160, the planarization layer 170, and the connection portion 180. The bump 112 is located on the substrate 110 and has the top surface 112a and the side surfaces 112b located in periphery of the top surface 112a. The gate 120 covers the bump 112 and is electrically connected to the scan line SL. The semiconductor layer 140 is located on the top surface 112a and the side surfaces 112b of the bump 112 and is further extended to the substrate 110 from at least one side surface 112b of the bump 112. The gate insulation layer 130 is located between the gate 120 and the semiconductor layer 140. The source S is located on at least one of the side surfaces 112b of the bump 112 and does not cover the top surface 112a of the bump 112, and the source S is extended to the substrate 110 from the at least one of the side surfaces 112b of the bump 112. Here, the source S is in contact with the semiconductor layer 140 and is electrically connected to the data line DL. The drain D is located on the top surface 112a of the bump 112 but does not cover the side surfaces 112b of the bump 112, and the drain D is in contact with the semiconductor layer 140. Here, neither the source S nor the drain D covers the semiconductor layer 140 on the corner section of the bump 112 between the top surface 112a and the side surfaces 112b. The connection portion 180 is located on the bump 112 and is electrically connected to the drain D, and the connection portion 180 is extended toward the pixel electrode 200 from the drain D. In the embodiment of FIG. 2A, the drain D and the connection portion 180 are formed as one-piece structure. The passivation layer 160 covers the source S, the drain D, and the semiconductor layer 140 but does not cover the connection portion 180 in the contact window C. The planarization layer 170 is located on the passivation layer 160 and does not cover the connection portion 180 in the contact window C. In the present embodiment, the thickness of the planarization layer 170 is greater than the height H1 of the bump 112, for instance, whereas the disclosure is not limited to the embodiment provided herein. In other embodiments, the thickness of the planarization layer 170 may be less than or equal to the height H1 of the bump 112. The pixel electrode 200 is located above the passivation layer 160 and the planarization layer 170 and electrically connected to the drain D of the active device 100a through the contact window C in the planarization layer 170 and the passivation layer 160. Besides, the extension direction of the scan line SL is different from that of the data line DL; preferably, the extension direction of the scan line SL is perpendicular to that of the data line DL. The scan line SL and the data line DL are located at different film layers, respectively, and an insulation layer (e.g., the gate insulation layer 130) is sandwiched between the scan line SL and the data line DL. The scan line SL and the data line DL are mainly capable of transmitting driver signals of the pixel structure.

The pixel structure provided herein may further include a common electrode line (not shown). The common electrode line and the scan line SL are in the same film layer, and the common electrode line is arranged adjacent to the scan line SL, for instance. The extension direction of the common electrode line is the same as the extension direction of the scan line SL but is different from the extension direction of the data line DL, and the common electrode line is coupled to the pixel electrode 200 to form a storage capacitor (not shown), for instance. The disclosure is not limited to the embodiment set forth herein. In another embodiment of the disclosure, the pixel structure may be applied in a fringe field switching (FFS) liquid crystal display (LCD) panel. Here, the pixel array substrate (i.e., the substrate 110 provided in the present embodiment) of the FFS LCD panel further includes a common electrode layer (not shown). The common electrode line is electrically connected to the common electrode layer, so as to reduce the overall resistance of the common electrode layer.

In view of the above, the height of the bump 112 in the pixel structure provided herein is adjustable, so as to change the distance of the channel length between the source S and the drain D. Hence, based on different design requirements, the proper W/L ratio can be obtained. Thereby, the pixel structure provided herein can prevent the reduction of the aperture ratio while the turned-on current is increased.

Additionally, as provided above, the semiconductor layer 140 can be formed while the patterned metal layer 151 is patterned in the same manufacturing process, and the detailed steps are provided below with reference to FIG. 11A to FIG. 11E.

FIG. 11A to FIG. 11E are cross-sectional flowcharts of several steps in a fabricating method of a pixel structure according to another embodiment. Specifically, steps shown in FIG. 1B to FIG. 1G can be replaced by those shown in FIG. 11A to FIG. 11E. The devices depicted in FIG. 11A to FIG. 11E are similar to those depicted in FIG. 1B to FIG. 1G; therefore, the identical or similar devices in these drawings are represented by the identical or similar reference numbers, and the materials and the manufacture of the devices will not be further explained.

Figure 11A:
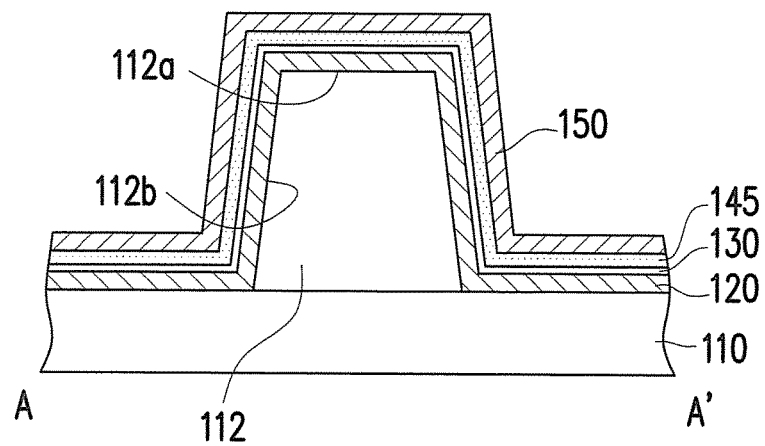
FIG. 11A to FIG. 11E are cross-sectional flowcharts of several steps in a fabricating method of a pixel structure according to another embodiment of the disclosure.
Figure 11B:
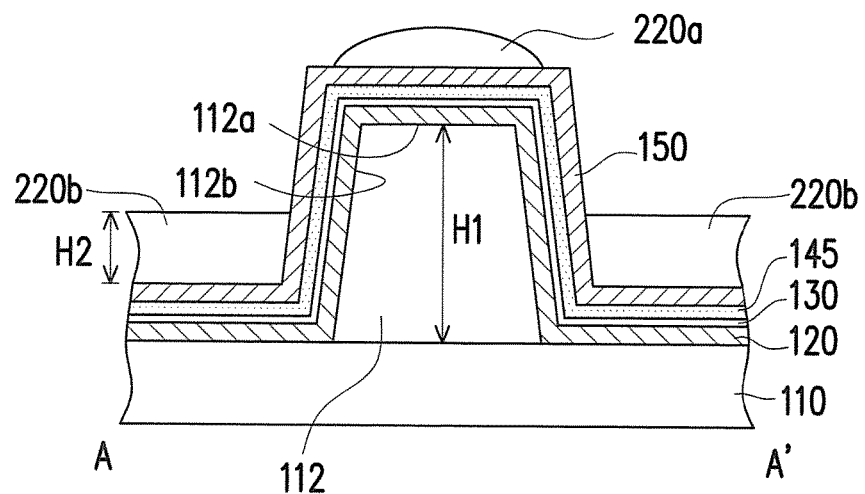
Figure 11C:
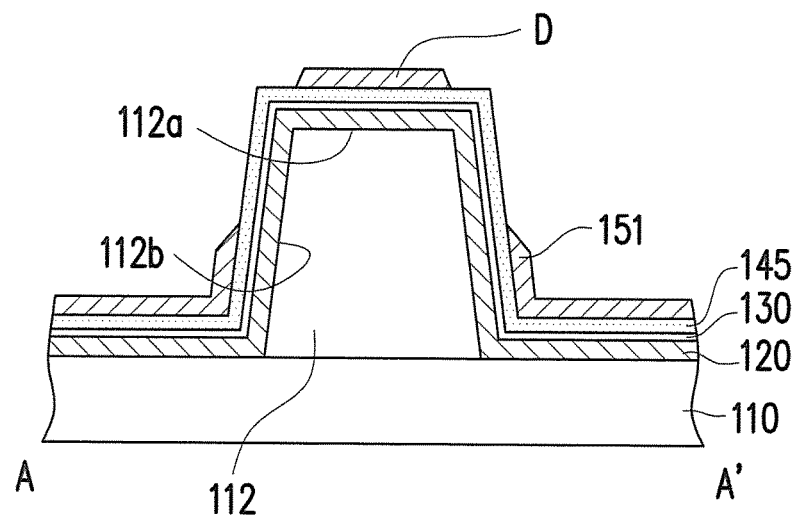
Figure 11D:
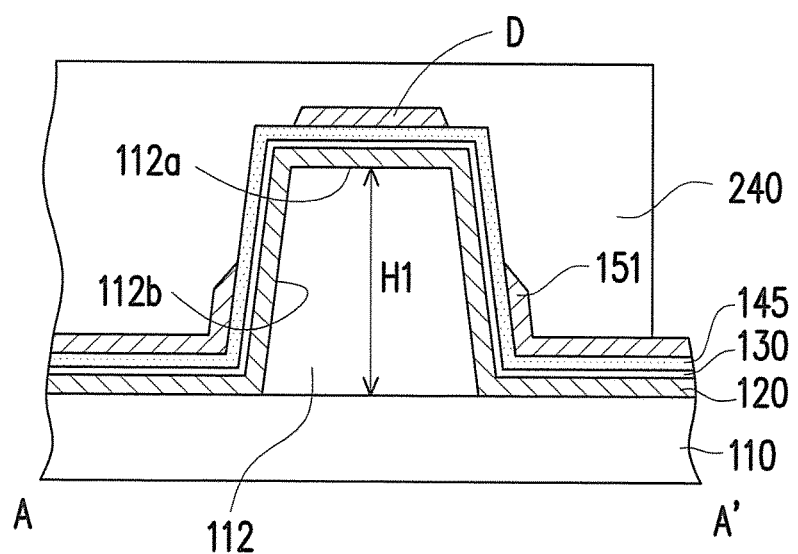
Figure 11E:
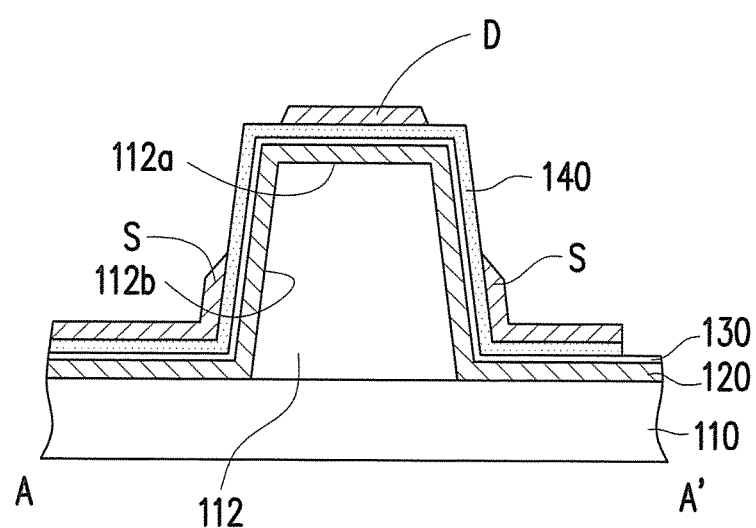

In the present embodiment, the fabricating method of the pixel structure is carried out by performing the step shown in FIG. 1A at first. The gate 120, the gate insulation layer 130, a semiconductor material layer 145, and the conductive layer 150 are sequentially formed on the substrate 110 and the bump 112, as shown in FIG. 11A. With reference to FIG. 11B, the patterned photoresist layer 220 is formed on the conductive layer 150. The patterned photoresist layer 220 includes the first photoresist portion 220a and the second photoresist portion 220b, and the thickness H2 of the patterned photoresist layer 220 is less than the height H1 of the bump 112. A first patterning process is performed on the conductive layer 150 with use of the patterned photoresist layer 220 as an etching mask, so as to form the drain D and the patterned conductive layer 151. If the semiconductor material layer 145 includes an ohmic contact layer (not shown), the semiconductor material layer 145 and the conductive layer 150 are patterned together, so as to remove the ohmic contact layer on the semiconductor channel. The patterned photoresist layer 220 is removed as shown in FIG. 11C. With reference to FIG. 11D, the patterned photoresist layer 240 is formed on the substrate 110, and the thickness of the patterned photoresist layer 240 is greater than the height H1 of the bump 112, thereby covering the drain D on the top surface 112a of the bump 112. A second patterning process is performed on the semiconductor material layer 145 and the patterned metal layer 151 with use of the patterned photoresist layer 240 as an etching mask, so as to form the semiconductor layer 140 on the bump 112 and form the source S and the data line DL in periphery of the bump 112, and the patterned photoresist layer 240 is then removed. The source S and the semiconductor layer 140 are further extended to the substrate 110 from the side surfaces 112b of the bump 112. Up to here, the fabrication of the active device 100a' in the present embodiment is completed. In the present embodiment, the semiconductor layer 140 and the source S of the active device 100a' are substantially formed with use of the same photomask. The active device 100a' is, for instance, a bottom-gate TFT, which should however not be construed as a limitation in the disclosure. The subsequent manufacturing process of the active device 100a' as shown in FIG. 11E can follow the manufacturing step shown in FIG. 1H, so as to completely form a pixel structure.

Figure 3A:
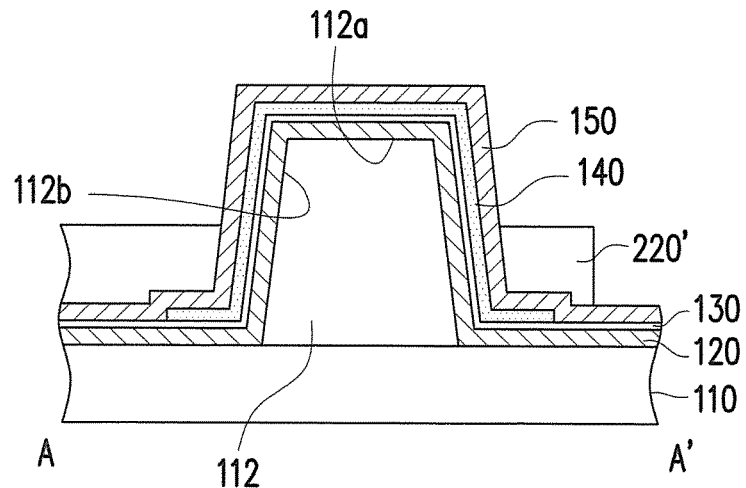
FIG. 3A to FIG. 3E are cross-sectional flowcharts of several steps in a fabricating method of a pixel structure according to another embodiment of the disclosure.

FIG. 3A to FIG. 3E are cross-sectional flowcharts of several steps in a fabricating method of a pixel structure according to another embodiment. Specifically, FIG. 3A to FIG. 3E are taken along a sectional line AA' in FIG. 4. FIG. 4 is a schematic top view illustrating the pixel structure depicted in FIG. 3E. In the present embodiment, the fabricating method of the pixel structure is carried out by performing the steps shown in FIG. 1A to FIG. 1D at first. After the patterned photoresist layer 220 is formed (as shown in FIG. 1D), an exposure process and a development process are performed on the patterned photoresist layer 220, so as to form a photoresist layer 220', as shown in FIG. 3A.

Figure 3B:
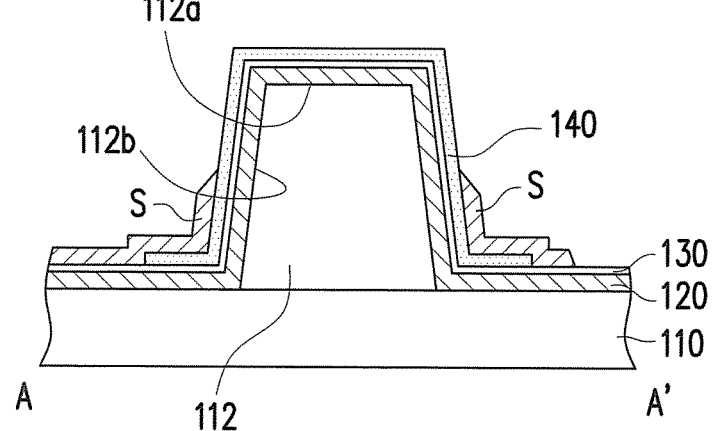
Figure 4:
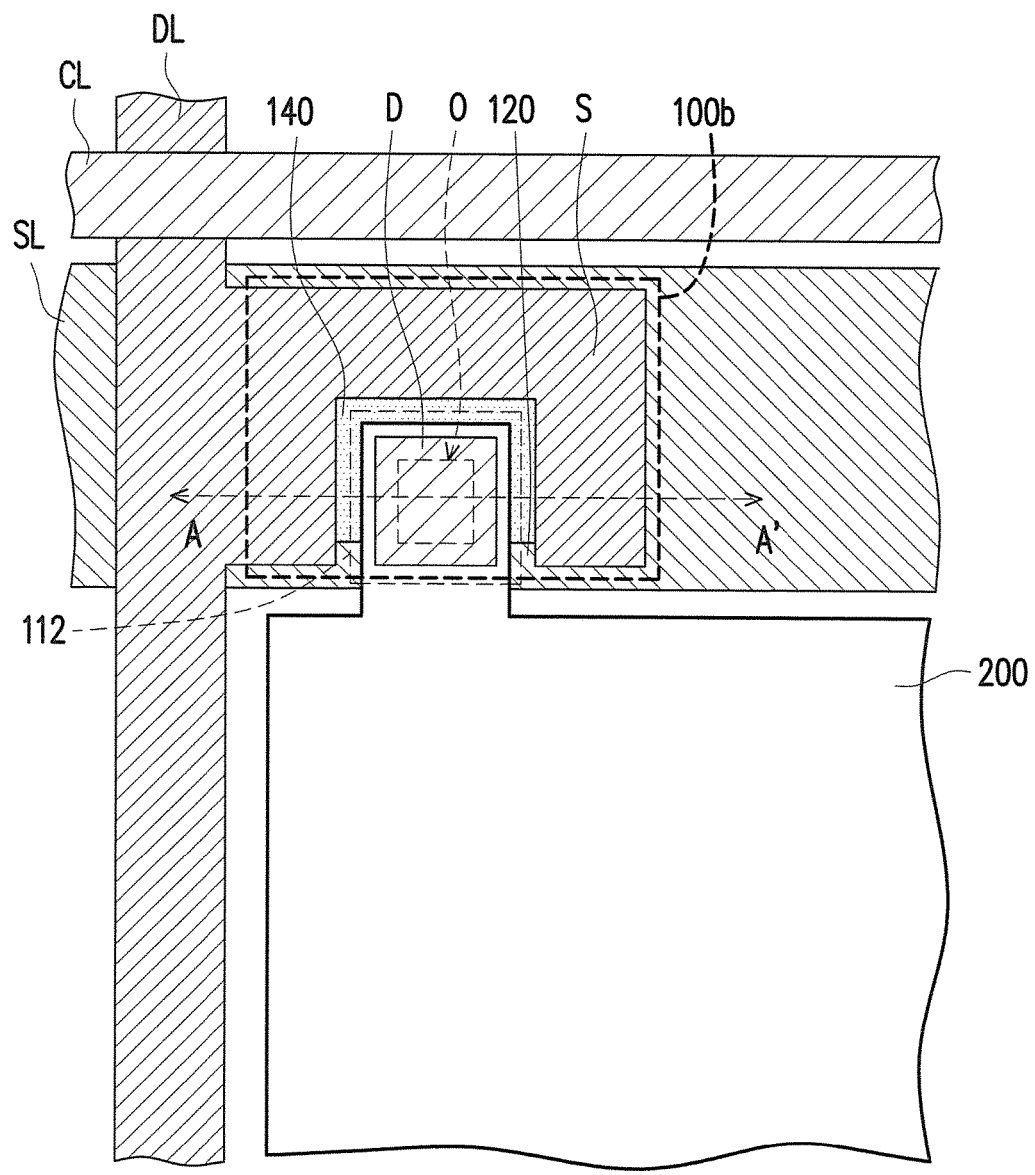
FIG. 4 is a schematic top view illustrating the pixel structure depicted in FIG. 3E.

With reference to FIG. 3B, a patterning process is performed on the conductive layer 150 with use of the photoresist layer 220' as an etching mask, so as to form the source S in periphery of the bump 112 and the data line DL, and the photoresist layer 220' is then removed. The source S is located on at least one of the side surfaces 112b of the bump 112 and extended to the substrate 110 from the at least one of the side surfaces 112b of the bump 112, and the source S is in contact with the semiconductor layer 140. Besides, the source S does not cover the semiconductor layer 140 located on the top surface 112a of the bump 112 and the corner section between the top surface 112a and the side surfaces 112b of the bump 112. That is, the source S partially covers at least one side surface 112b of the bump 112 but does not cover the top surface 112a of the bump 112. Besides, the source S and the data line DL are connected to each other, as shown in FIG. 4.

Figure 3C:
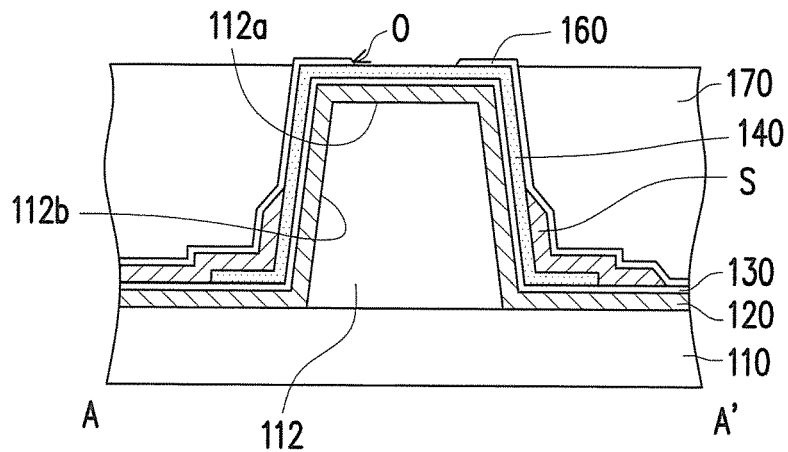

With reference to FIG. 3C, the passivation layer 160 and the planarization layer 170 are sequentially formed on the substrate 110 and are patterned, so as to form an opening O exposing or uncovering the semiconductor layer 140 on the top surface 112a of the bump 112. The passivation layer 160 covers the semiconductor layer 140, the source S, and the data line DL.

Figure 3D:
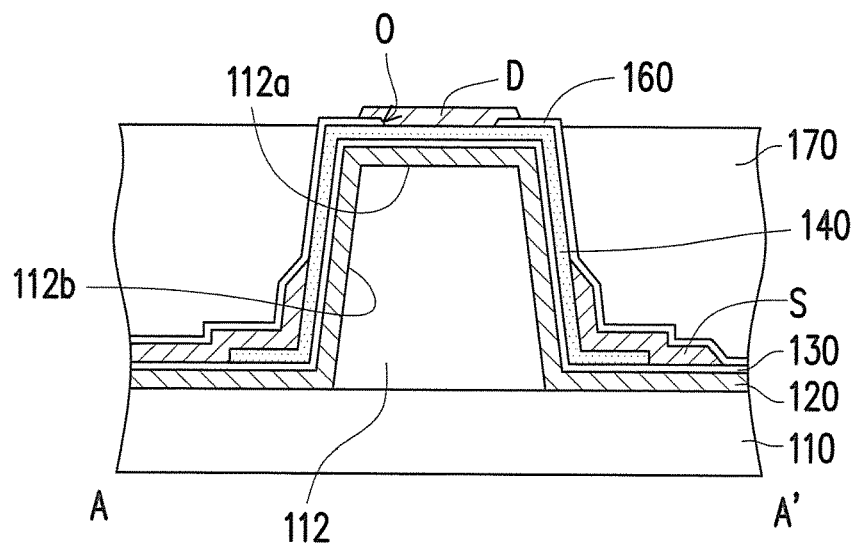

With reference to FIG. 3D, a second conductive layer (not shown) is formed on the passivation layer 160 and the planarization layer 170 and then is patterned, so as to form the drain D. The drain D is located on the passivation layer 160 and is in contact with the semiconductor layer 140 through the opening O of the passivation layer 160. Particularly, the drain D is located on the top surface 112a of the bump 112 and does not cover the side surfaces 112b of the bump 112 nor cover the semiconductor layer 140 located on the corner section of the bump 112 between the top surface 112a and the side surfaces 112b. In the present embodiment, the material of the source S may be different from that of the drain D, whereas the disclosure is not limited thereto. In another embodiment, the source S and the drain D may be made of the same material. Up to here, the fabrication of the active device 100b in the present embodiment is completed. In the present embodiment, the active device 100b is, for instance, a bottom-gate TFT, which should however not be construed as a limitation in the disclosure.

Figure 3E:
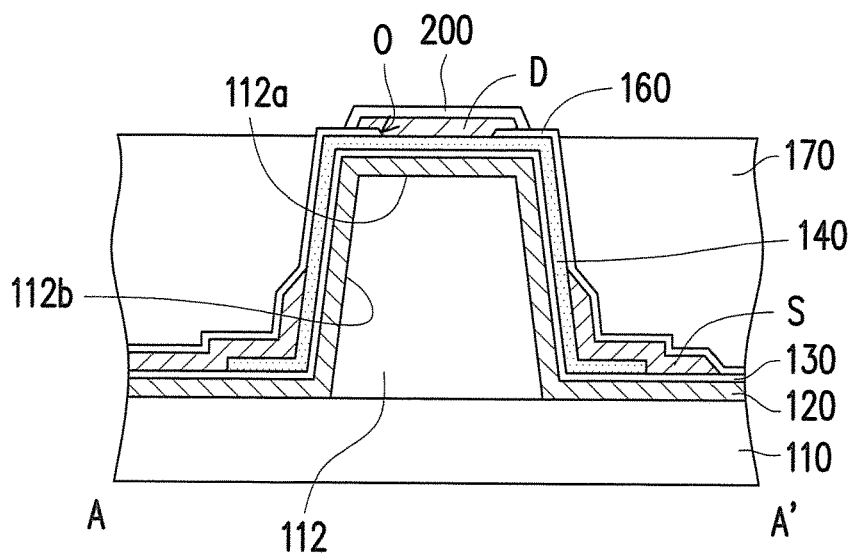

With reference to FIG. 3E and FIG. 4, the pixel electrode 200 is sequentially formed on the active device 100b, and the pixel electrode 200 is electrically connected to the drain D of the active device 100b. Particularly, the pixel electrode 200 provided herein can be directly connected to the drain D.

Besides, before the pixel electrode 200 is formed, the common electrode line CL can be formed while the drain D is formed, as shown in FIG. 4. That is, the common electrode line CL and the drain D are simultaneously defined. The common electrode line CL and the drain D are in the same film layer, and the common electrode line CL is arranged adjacent to the scan line SL, for instance. Here, the extension direction of the common electrode line CL is the same as the extension direction of the scan line SL and different from the extension direction of the data line DL, for instance; however, the disclosure is not limited thereto. The common electrode line CL provided in the present embodiment is coupled to the pixel electrode 200 to form a storage capacitor (not shown). In another embodiment, the common electrode line CL and the scan line SL are in the same film layer, and the common electrode line CL is arranged adjacent to the scan line SL, for instance. The extension direction of the common electrode line CL is the same as the extension direction of the scan line SL but is different from the extension direction of the data line DL, and the common electrode line CL is coupled to the pixel electrode 200 to form a storage capacitor (not shown), for instance. Note that the disclosure is not limited to the embodiment set forth herein. In still another embodiment of the disclosure, the pixel structure may be applied in a FFS LCD panel. Here, the pixel array substrate (i.e., the substrate 110 provided in the present embodiment) of the FFS LCD panel further includes a common electrode layer (not shown). The common electrode line CL is electrically connected to the common electrode layer, so as to reduce the overall resistance of the common electrode layer.

With reference to FIG. 3E and FIG. 4, structurally speaking, the pixel structure provided in the present embodiment has the scan line SL, the data line DL, the bump 112, the active device 100b, and the pixel electrode 200. The active device 100b includes the gate 120, the gate insulation layer 130, the semiconductor layer 140, the source S, and the drain D. In the present embodiment, the pixel structure further includes the passivation layer 160, the planarization layer 170, and the common electrode line CL. The bump 112 is located on the substrate 110 and has the top surface 112a and the side surfaces 112b located in periphery of the top surface 112a. The gate 120 covers the bump 112 and is electrically connected to the scan line SL. The semiconductor layer 140 is located on the top surface 112a and the side surfaces 112b of the bump 112 and is further extended to the substrate 110 from at least one side surface 112b of the bump 112. The gate insulation layer 130 is located between the gate 120 and the semiconductor layer 140. The source S is located on at least one of the side surfaces 112b of the bump 112 and does not cover the top surface 112a of the bump 112, and the source S is extended to the substrate 110 from the at least one of the side surfaces 112b of the bump 112. Here, the source S is in contact with the semiconductor layer 140 and is electrically connected to the data line DL. The passivation layer 160 covers a portion of the semiconductor layer 140, the source S, and the data line DL, and the passivation layer 160 has the opening O located on the top surface 112a of the bump 112. The drain D is located on the passivation layer 160 and on the top surface 112a of the bump 112 but does not cover the side surfaces 112b of the bump 112, and the drain D is in contact with the semiconductor layer 140 through the opening O of the passivation layer 160. Here, neither the source S nor the drain D covers the semiconductor layer 140 on the corner section of the bump 112 between the top surface 112a and the side surfaces 112b. The planarization layer 170 is located on the passivation layer 160 and does not cover the top surface 112a of the bump 112 and the opening O of the passivation layer 160. The pixel electrode 200 is located on the drain D and electrically connected to the drain D of the active device 100b. The common electrode line CL and the drain D are in the same film layer according to the present embodiment, and the common electrode line CL is coupled to the pixel electrode 200 to form a storage capacitor.

In view of the above, the height of the bump 112 in the pixel structure provided herein is adjustable, so as to change the distance of the channel length between the source S and the drain D. Hence, based on different design requirements, the proper W/L ratio can be obtained. Thereby, the pixel structure provided herein can prevent the reduction of the aperture ratio while the turned-on current is increased.

Figure 5A:
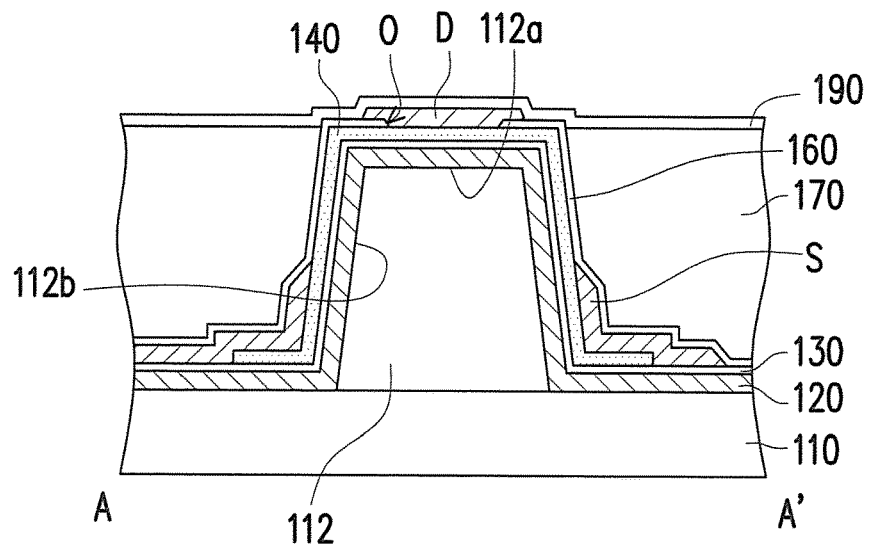
FIG. 5A and FIG. 5B are cross-sectional flowcharts of several steps in a fabricating method of a pixel structure according to another embodiment of the disclosure.
Figure 5B:
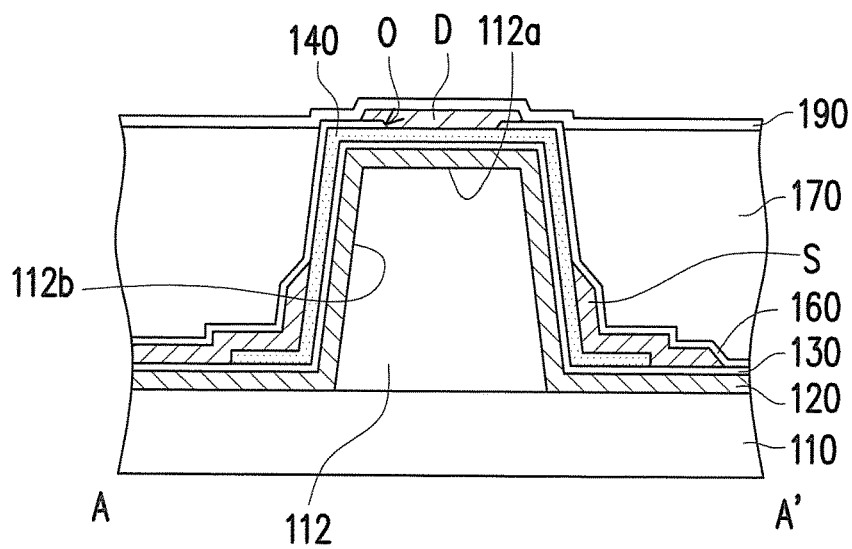
Figure 6:
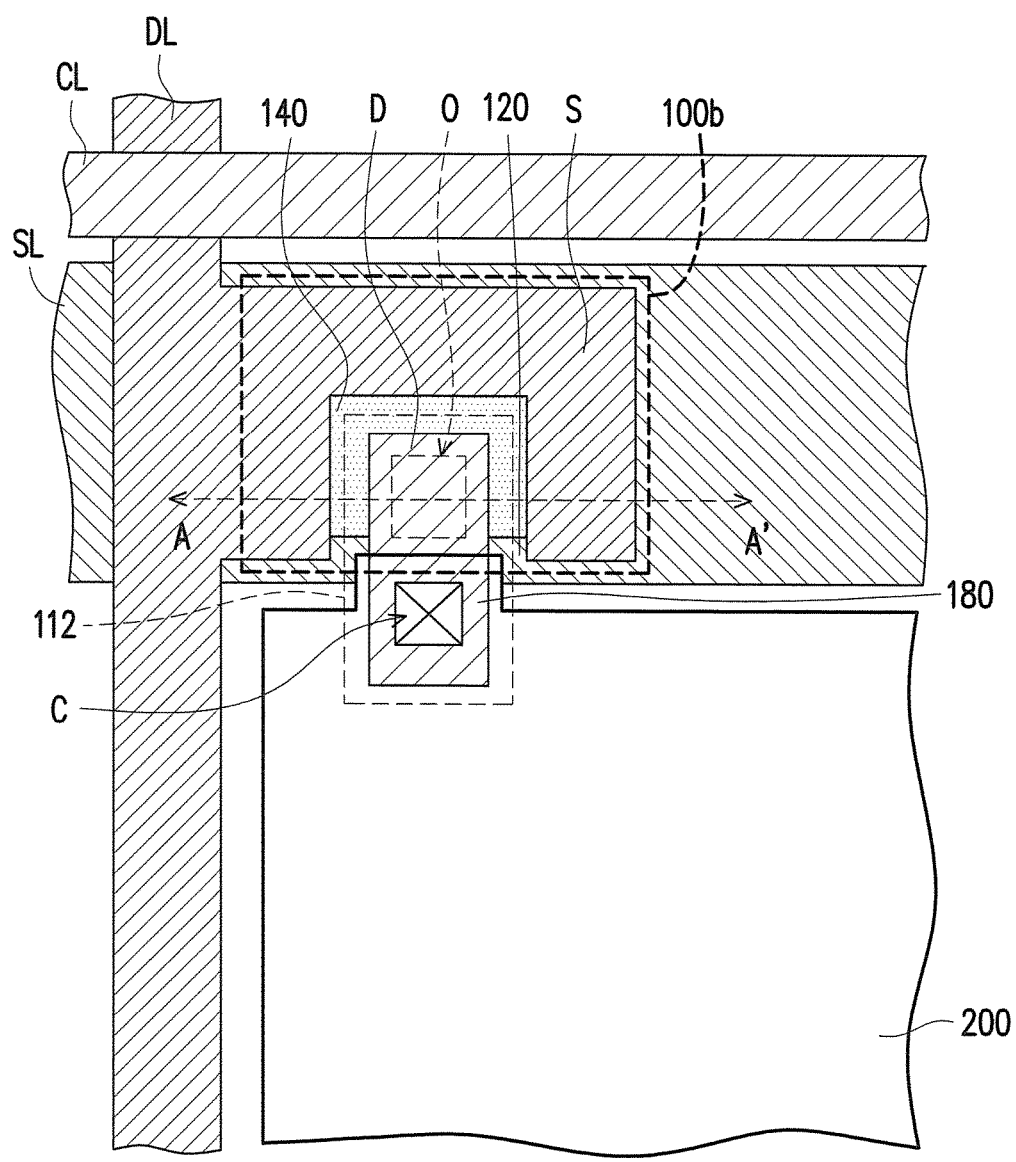
FIG. 6 is a schematic top view illustrating the pixel structure depicted in FIG. 5B.

FIG. 5A and FIG. 5B are cross-sectional flowcharts of several steps in a fabricating method of a pixel structure according to another embodiment. Specifically, FIG. 5A and FIG. 5B are taken along a sectional line AA' in FIG. 6. FIG. 6 is a schematic top view illustrating the pixel structure depicted in FIG. 5B. The pixel structure depicted in FIG. 5B is similar to that depicted in FIG. 3E; therefore, the identical or similar devices in these embodiments are represented by the identical or similar reference numbers and will not be further explained. The pixel structure provided in the present embodiment and the pixel structure depicted in FIG. 3E have the same active device 100b, as shown in FIG. 3D, and the difference between the two pixel structures lies in that the pixel structure provided herein further includes a connection portion 180 connected to the drain D, and an insulation layer 190 is formed above the drain D and the connection portion 180, as shown in FIG. 5A. Besides, the insulation layer 190 is patterned to form a contact window C exposing or uncovering the connection portion 180. Moreover, the contact window C of the insulation layer 190 and the opening O of the passivation layer 160 are not overlapped according to the present embodiment; however, the disclosure is not limited thereto. In another embodiment, the insulation layer 190 can be patterned to form the contact window C exposing the drain D, such that the contact window C of the insulation layer 190 and the opening O of the passivation layer 160 are overlapped.

Specifically, in the present embodiment, before the pixel electrode 200 is formed, the connection portion 180 connected to the drain D can be formed patterning the second conductive layer to simultaneously form the drain D and the common electrode line CL. The drain D and the connection portion 180 that is connected to the drain D are located on the top surface 112a of the bump 112 but neither cover the side surfaces 112b of the bump 112 nor cover the semiconductor layer 140 located on the corner section of the bump 112 between the top surface 112a and the side surfaces 112b. The drain D is arranged corresponding to the gate 120, and the connection portion 180 is not overlapped with the gate 120. One end of the connection portion 180 is connected to the drain D and is located on the semiconductor layer 140, and the connection portion 180 is extended toward the pixel electrode 200 along the top surface 112a of the bump 112. That is, the connection portion 180 is extended toward the pixel electrode 200 from the drain D for electrically connecting the drain D and the pixel electrode 200. However, the disclosure is not limited thereto; in another embodiment, the connection portion 180 connected to the drain D and the drain D may belong to two different film layers and the connection portion 180 and the drain D may be respectively formed by performing two patterning processes, for instance.

With reference to FIG. 5B and FIG. 6, the pixel electrode 200 is formed on the active device 100b. Particularly, after the contact window C is formed in the insulation layer 190, the pixel electrode 200 is formed on the insulation layer 190 according to the present embodiment. The pixel electrode 200 is connected to the connection portion 180 through the contact window C of the insulation layer 190. That is, the pixel electrode 200 is electrically connected to the drain D of the active device 100b.

Structurally speaking, the pixel structure provided in the present embodiment has the scan line SL, the data line DL, the bump 112, the active device 100b, and the pixel electrode 200. The active device 100b includes the gate 120, the gate insulation layer 130, the semiconductor layer 140, the source S, and the drain D. In the present embodiment, the pixel structure further includes the passivation layer 160, the planarization layer 170, the connection portion 180, the insulation layer 190, and the common electrode line CL. The bump 112 is located on the substrate 110 and has the top surface 112a and the side surfaces 112b located in periphery of the top surface 112a. The gate 120 covers the bump 112 and is electrically connected to the scan line SL. The semiconductor layer 140 is located on the top surface 112a and the side surfaces 112b of the bump 112 and is further extended to the substrate 110 from at least one side surface 112b of the bump 112. The gate insulation layer 130 is located between the gate 120 and the semiconductor layer 140. The source S is located on at least one of the side surfaces 112b of the bump 112 and does not cover the top surface 112a of the bump 112, and the source S is extended to the substrate 110 from the at least one of the side surfaces 112b of the bump 112. Here, the source S is in contact with the semiconductor layer 140 and is electrically connected to the data line DL. The passivation layer 160 covers a portion of the semiconductor layer 140, the source S, and the data line DL, and the passivation layer 160 has the opening O. The drain D is located on the passivation layer 160 and on the top surface 112a of the bump 112 but does not cover the side surfaces 112b of the bump 112, and the drain D is in contact with the semiconductor layer 140 through the opening O of the passivation layer 160. Here, neither the source S nor the drain D covers the semiconductor layer 140 on the corner section of the bump 112 between the top surface 112a and the side surfaces 112b. The connection portion 180 is located on the bump 112 and the passivation layer 160 and is electrically connected to the drain D, and the connection portion 180 is extended toward the pixel electrode 200 from the drain D. The planarization layer 170 is located on the passivation layer 160 and does not cover the opening O of the passivation layer 160. The insulation layer 190 is located on the drain D, the connection portion 180, and the planarization layer 170 and has the contact window C. The pixel electrode 200 is located above the insulation layer 190 and electrically connected to the drain D of the active device 100b through the contact window C and the connection portion 180. The common electrode line CL and the drain D are in the same film layer according to the present embodiment, and the common electrode line CL is coupled to the pixel electrode 200 to form a storage capacitor.

In view of the above, the height of the bump 112 in the pixel structure provided herein is adjustable, so as to change the distance of the channel length between the source S and the drain D. Hence, based on different design requirements, the proper W/L ratio can be obtained. Thereby, the pixel structure provided herein can prevent the reduction of the aperture ratio while the turned-on current is increased.

Figure 7:
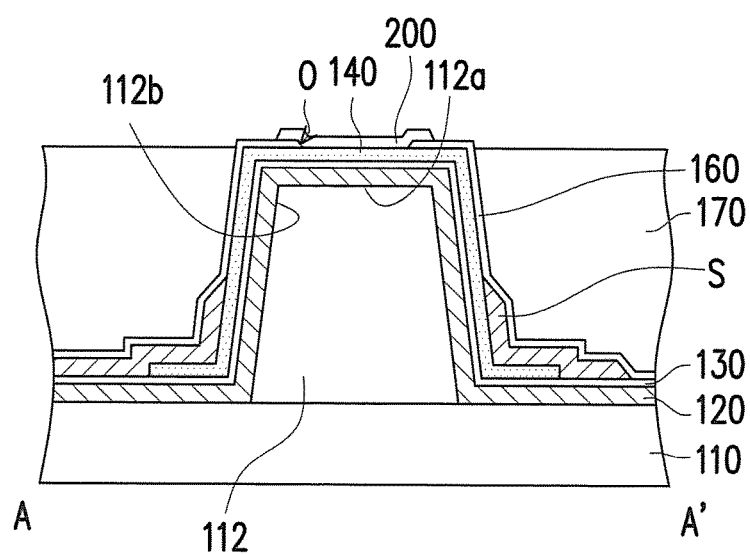
FIG. 7 is a cross-sectional view illustrating a step in a fabricating method of a pixel structure according to another embodiment of the disclosure.
Figure 8:
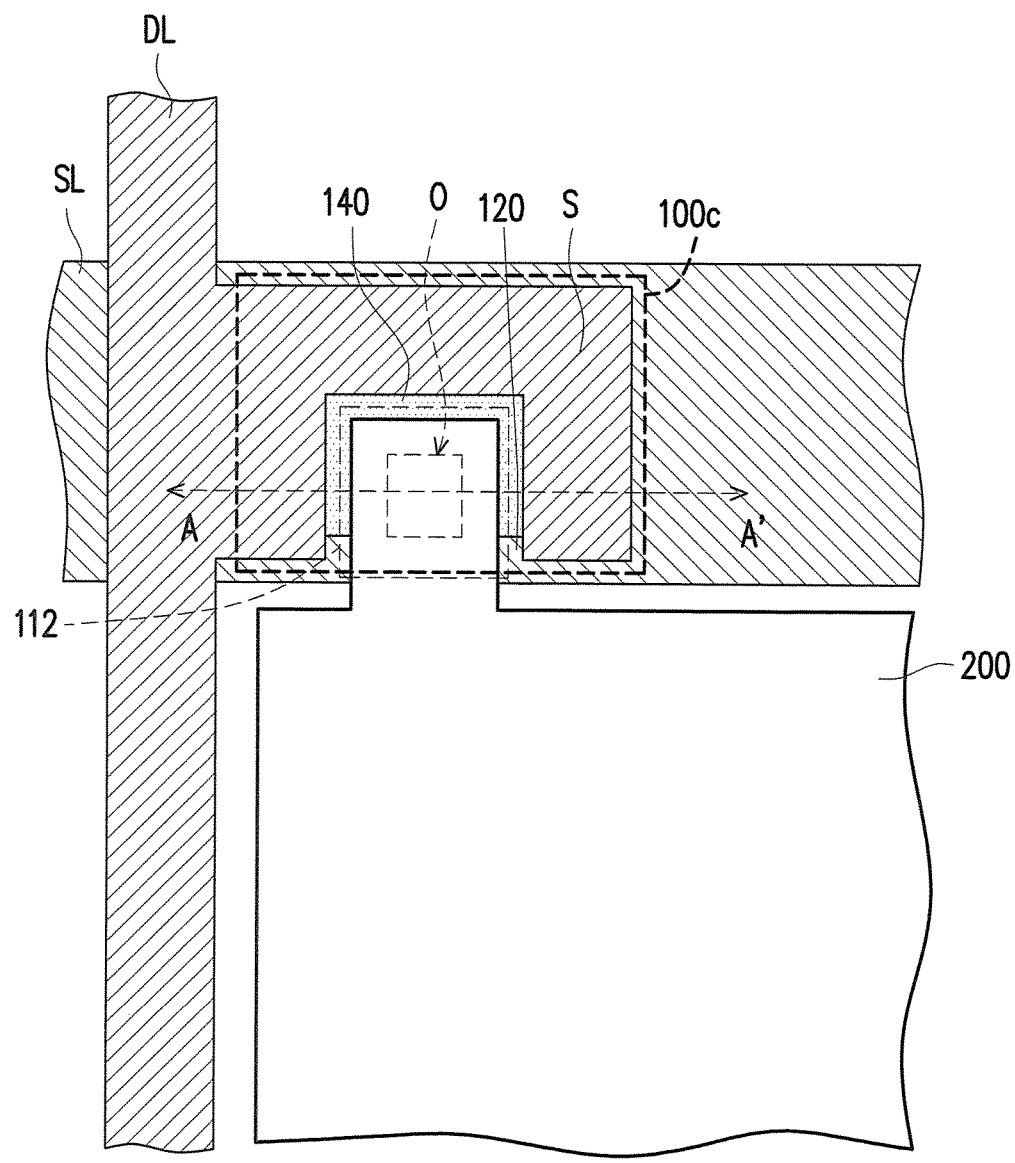
FIG. 8 is a schematic top view illustrating the pixel structure depicted in FIG. 7.

FIG. 7 is a cross-sectional view illustrating a step in a fabricating method of a pixel structure according to another embodiment. Specifically, FIG. 7 is taken along a sectional line AA' in FIG. 8. FIG. 8 is a schematic top view illustrating the pixel structure depicted in FIG. 7. The pixel structure depicted in FIG. 7 is similar to that depicted in FIG. 3E; therefore, the identical or similar devices in these embodiments are represented by the identical or similar reference numbers and will not be further explained. The difference between the pixel structure provided herein and the pixel structure depicted in FIG. 3E rests in that the drain and the pixel electrode 200 of the pixel structure are defined by the same photomask and have the same material according to the present embodiment. In the present embodiment, the fabricating method of the pixel structure is carried by firstly performing the steps shown in FIG. 1A to FIGS. 1D and 1n FIG. 3A to FIG. 3C and then forming the pixel electrode 200 on the passivation layer 160 and the planarization layer 170, as shown in FIG. 7.

With reference to FIG. 7, the pixel electrode 200 is located on the passivation layer 160 and is in direct contact with the semiconductor layer 140 through the opening O of the passivation layer 160. Hence, the pixel electrode 200 provided in the present embodiment not only serves as the pixel electrode of the active device 100c but also acts as the drain of the active device 100c. Different from the pixel structure provided in the previous embodiments, the pixel structure provided herein does not require any connection portion that is configured to electrically connect the pixel structure and the drain of the active device.

With reference to FIG. 7 and FIG. 8, structurally speaking, the pixel structure provided in the present embodiment has the scan line SL, the data line DL, the bump 112, the active device 100c, and the pixel electrode 200. The active device 100c includes the gate 120, the gate insulation layer 130, the semiconductor layer 140, the source S, and the drain (i.e., a part of the pixel electrode 200). In the present embodiment, the pixel structure further includes the passivation layer 160 and the planarization layer 170. The bump 112 is located on the substrate 110 and has the top surface 112a and the side surfaces 112b located in periphery of the top surface 112a. The gate 120 covers the bump 112 and is electrically connected to the scan line SL. The semiconductor layer 140 is located on the top surface 112a and the side surfaces 112b of the bump 112 and is further extended to the substrate 110 from at least one side surface 112b of the bump 112. The gate insulation layer 130 is located between the gate 120 and the semiconductor layer 140. The source S is located on at least one of the side surfaces 112b of the bump 112 and does not cover the top surface 112a of the bump 112, and the source S is extended to the substrate 110 from the at least one of the side surfaces 112b of the bump 112. The source S is in contact with the semiconductor layer 140 and is electrically connected to the data line DL. Here, neither the source S nor the drain covers the semiconductor layer 140 on the corner section of the bump 112 between the top surface 112a and the side surfaces 112b. The passivation layer 160 covers a portion of the semiconductor layer 140, the source S, and the data line DL, and the passivation layer 160 has the opening O. The planarization layer 170 is located on the passivation layer 160 and does not cover the opening O of the passivation layer 160. The pixel electrode 200 is located on the passivation layer 160 and the planarization layer 170 and is in contact with the semiconductor layer 140 through the opening O of the passivation layer 160, such that a part of the pixel electrode 200 in contact with the semiconductor layer 140 also act as the drain of the active device 100c.

The pixel structure provided herein may further include a common electrode line (not shown). The common electrode line and the scan line SL are in the same film layer, and the common electrode line is arranged adjacent to the scan line SL, for instance. The extension direction of the common electrode line is the same as the extension direction of the scan line SL but is different from the extension direction of the data line DL, and the common electrode line is coupled to the pixel electrode 200 to form a storage capacitor (not shown), for instance. The disclosure is not limited to the embodiment set forth herein. In still another embodiment of the disclosure, the pixel structure may be applied in a FFS LCD panel. Here, the pixel array substrate (i.e., the substrate 110 provided in the present embodiment) of the FFS LCD panel further includes a common electrode layer (not shown). The common electrode line is electrically connected to the common electrode layer, so as to reduce the overall resistance of the common electrode layer.

In view of the above, the height of the bump 112 in the pixel structure provided herein is adjustable, so as to change the distance of the channel length between the source S and the drain D. Hence, based on different design requirements, the proper W/L ratio can be obtained. Thereby, the pixel structure provided herein can prevent the reduction of the aperture ratio while the turned-on current is increased.

Figure 9:
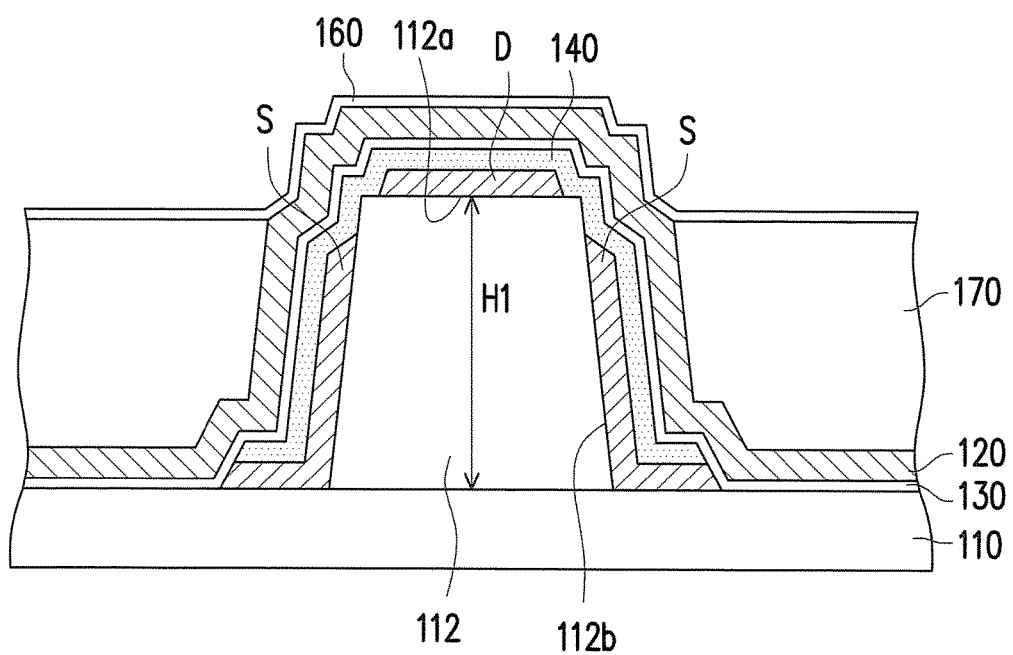
FIG. 9 is a schematic cross-sectional view illustrating a pixel structure along a sectional line AA' according to another exemplary embodiment of the disclosure.
Figure 10:
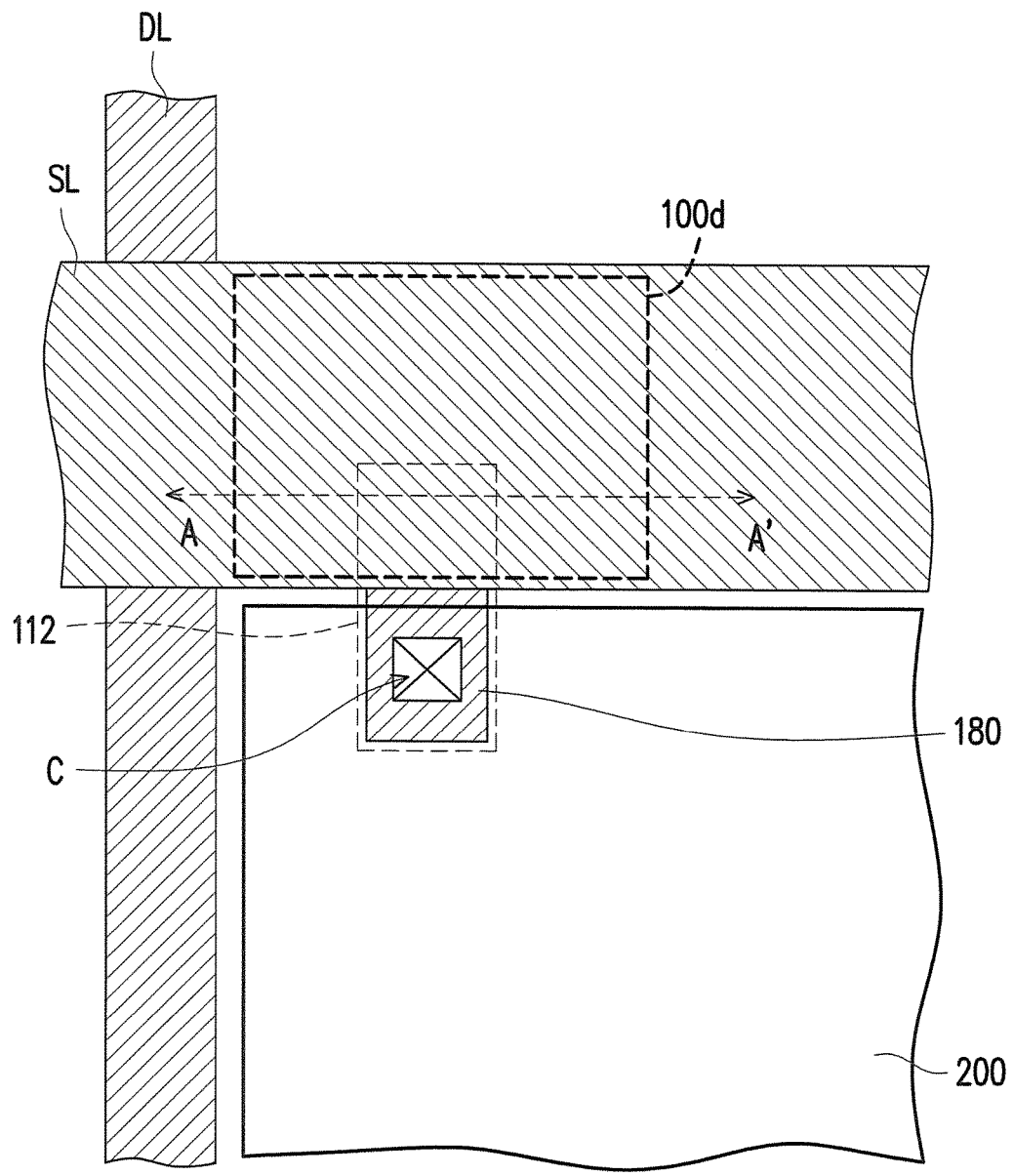
FIG. 10 is a schematic top view illustrating the pixel structure depicted in FIG. 9.

FIG. 9 is a schematic cross-sectional view illustrating a pixel structure along a sectional line AA' according to another exemplary embodiment. FIG. 10 is a schematic top view illustrating the pixel structure depicted in FIG. 9. The pixel structure depicted in FIG. 9 is similar to the pixel structure provided in the previous embodiments; therefore, the identical or similar devices in these embodiments are represented by the identical or similar reference numbers, have the same or similar materials and manufacturing processes, and will not be further explained. For instance, the difference between the pixel structure provided in the present embodiment and the pixel structure depicted in FIG. 1H lies in that the pixel structure provided herein includes the active device 100d with the top-gate TFT.

With reference to FIG. 9 and FIG. 10, the bump 112 is formed on the substrate 110. Here, the bump 112 has the top surface 112a and the side surfaces 112b in periphery of the top surface 112a. Besides, the bump 112 has the height H1 within a range from about 1 μm to about 5 μm, preferably from about 2 μm to about 4 μm; however, the disclosure should not be limited thereto. A conductive layer (not shown) is formed on the bump 112. A patterned photoresist layer (not shown) is formed on the conductive layer. Here, the thickness of the patterned photoresist layer is less than the height H1 of the bump 112; thereby, the patterned photoresist layer can define the boundary between the drain D and the source by the protruding profile of the bump 112. The drain D on the top surface 112a of the bump 112 is formed by patterning the conductive layer with use of the patterned photoresist layer as the etching mask. A photoresist layer is again formed on the conductive layer. Here, thickness of the patterned photoresist layer is greater than the height H1 of the bump 112, such that the patterned photoresist layer covers the drain D. The conductive layer is patterned with use of the photoresist layer as an etching mask, so as to define the source S and the data line DL connected to the source S in periphery of the bump 112. Here, the source S partially covers the side surfaces 112b of the bump and is extended to the substrate 110 from at least one side surface 112b of the bump 112. Note that the source S is not formed on the corner section of the bump 112 between the top surface 112a and the side surfaces 112b. The semiconductor layer 140 is formed on the source S and the drain D. Here, the semiconductor layer 140 is located on the top surface 112a and at least one of the side surfaces 112b of the bump 112, and the semiconductor layer 140 is further extended to the substrate 110 from at least one side surface 112b of the bump 112. The gate insulation layer 130 is formed on the semiconductor layer 140 and the substrate 110. The gate 120 and the scan line SL connected to the gate 120 are formed on the gate insulation layer 130. The planarization layer 170 and the passivation layer 160 are sequentially formed, and the passivation layer 160, the planarization layer 170, and the gate insulation layer 130 are patterned to form the contact window C. The pixel electrode 200 is formed, and the pixel electrode 200 is electrically connected to the drain D through the contact window C.

According to the present embodiment, before the semiconductor layer 140 is formed on the source S and the drain D, the connection portion 180 connected to the drain D is formed. The connection portion 180 is located on the top surface 112a of the bump 112 but neither covers the side surfaces 112b of the bump 112 nor covers a corner section of the bump 112 between the top surface 112a and the side surfaces 112b. One end of the connection portion 180 is connected to the drain D, and the connection portion 180 is extended to the pixel electrode 200 along the top surface 112a of the bump 112. That is, the connection portion 180 is extended toward the pixel electrode 200 from the drain D for connecting the drain D and the pixel electrode 200. Namely, in the present embodiment, after the source S, the drain D, and the connection portion 180 connected to the drain D are formed, the semiconductor layer 140, the gate insulation layer 130, the gate 120, the planarization layer 170, and the passivation layer 160 are sequentially formed. The passivation layer 160, the planarization layer 170, and the gate insulation layer 130 are patterned to form the contact window C that exposes or doesn't cover the connection portion 180. The pixel electrode 200 is then formed. Here, the connection portion 180 is located below the pixel electrode 200, and the pixel electrode 200 is connected to the connection portion 180 through the contact window C. That is, the pixel electrode 200 is electrically connected to the drain D through the contact window C.

With reference to FIG. 9 and FIG. 10, structurally speaking, the pixel structure provided in the present embodiment has the scan line SL, the data line DL, the bump 112, the active device 100d, and the pixel electrode 200. The active device 100d includes the gate 120, the gate insulation layer 130, the semiconductor layer 140, the source S, and the drain D. In the present embodiment, the pixel structure further includes the passivation layer 160, the planarization layer 170, and the connection portion 180.

The bump 112 is located on the substrate 110 and has the top surface 112a and the side surfaces 112b located in periphery of the top surface 112a. The source S is located on at least one of the side surfaces 112b of the bump 112 and does not cover the top surface 112a of the bump 112, and the source S is extended to the substrate 110 from the at least one of the side surfaces 112b of the bump 112. Here, the source S is electrically connected to the data line DL. The drain D is located on the top surface 112a of the bump 112 but does not cover the side surfaces 112b of the bump 112. The connection portion 180 is located on the bump 112 and is electrically connected to the drain D, and the connection portion 180 is extended toward the pixel electrode 200 from the drain D. The semiconductor layer 140 is located on the top surface 112a and the side surfaces 112b of the bump 112 and extended to the substrate 110 from at least one of the side surfaces 112b of the bump 112, and the semiconductor layer 140 is in contact with the source S that covers at least one side surface 112b of the bump 112 and in contact with the drain D 112 located on the top surface 112a of the bump 112. Here, neither the source S nor the drain D is in contact with or overlapped with the semiconductor layer 140 on the corner section of the bump 112 between the top surface 112a and the side surfaces 112b. The gate insulation layer 130 covers the source S, the drain D, the connection portion 180, the semiconductor layer 140, and the substrate 110. The gate 120 covers the gate insulation layer 130 and is electrically connected to the scan line SL. Namely, the gate insulation layer 130 is located between the gate 120 and the semiconductor layer 140. The planarization layer 170 is located on the gate 120 and covers the source S and the connection portion 180. The passivation layer 160 covers the planarization layer 170 and covers the gate 120. The pixel electrode 200 is located above the passivation layer 160 and electrically connected to the drain D of the active device 100d through the contact window C in the planarization layer 170, the passivation layer 160, and the gate insulation layer 130. Besides, the extension direction of the scan line SL is different from that of the data line DL; preferably, the extension direction of the scan line SL is perpendicular to that of the data line DL. The scan line SL and the data line DL are located at different film layers, respectively, and an insulation layer (e.g., the gate insulation layer 130) is sandwiched between the scan line SL and the data line DL.

The scan line SL and the data line DL are mainly capable of transmitting driver signals of the pixel structure.

The pixel structure provided herein may further include a common electrode line (not shown). The common electrode line and the scan line SL are in the same film layer, and the common electrode line is arranged adjacent to the scan line SL, for instance. The extension direction of the common electrode line is the same as the extension direction of the scan line SL but is different from the extension direction of the data line DL, and the common electrode line is coupled to the pixel electrode 200 to form a storage capacitor (not shown), for instance. The disclosure is not limited to the embodiment set forth herein. In still another embodiment of the disclosure, the pixel structure may be applied in a FFS LCD panel. Here, the pixel array substrate (i.e., the substrate 110 provided in the present embodiment) of the FFS LCD panel further includes a common electrode layer (not shown). The common electrode line is electrically connected to the common electrode layer, so as to reduce the overall resistance of the common electrode layer.

To sum up, in the pixel structure provided herein, the height of the bump 112 can be adjusted by simply changing manufacturing parameters according to different design requirements, so as to change the distance of the channel length between the source S and the drain D and obtain the proper W/L ratio. Thereby, when the turned-on current of the pixel structure is increased, the loss of aperture ratio can be prevented, and the manufacturing complexity is not increased.

Although the disclosure has been provided with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

What is claimed is:

1. A pixel structure comprising:
   a scan line and a data line both located on a substrate;
   a bump located on the substrate, the bump having a top surface and a plurality of side surfaces located in periphery of the top surface;
   an active device located on the substrate and comprising:
      a gate covering the bump, the gate being electrically connected to the scan line;
      a semiconductor layer located on the top surface and the side surfaces of the bump;
      a gate insulation layer located between the gate and the semiconductor layer;
      a source located on at least one of the side surfaces of the bump, the source being in contact with the semiconductor layer and electrically connected to the data line, wherein the source covers the at least one of the side surfaces of the bump but does not cover the semiconductor layer located on the top surface of the bump; and
      a drain located on the top surface of the bump, wherein the drain is in contact with the semiconductor layer and does not cover the semiconductor layer located on a corner section of the bump between the top surface and the side surfaces; and
   a pixel electrode electrically connected to the drain of the active device.
2. The pixel structure of claim 1, wherein the source partially covers the substrate.
3. The pixel structure of claim 1, wherein the source does not cover the semiconductor layer located on the corner section of the bump between the top surface and the side surfaces.
4. The pixel structure of claim 1, further comprising a connection portion located on the semiconductor layer and extended to the pixel electrode from the drain for connecting the drain and the pixel electrode, wherein the drain is located on the top surface of the bump and does not cover the side surfaces, one end of the connection portion is connected to the drain, and the connection portion is extended to the pixel electrode along one of the side surfaces of the bump.
5. The pixel structure of claim 1, wherein
   the gate is located on the top surface and the side surfaces of the bump,
   the gate insulation layer covers the gate,
   the semiconductor layer covers the gate insulation layer located on the top surface and the side surfaces of the bump,
   the drain is located on the semiconductor layer on top surface of the bump, and
   the source is located on the semiconductor layer on the at least one of the side surfaces of the bump.
6. The pixel structure of claim 5, further comprising a passivation layer covering the source, wherein the passivation layer has an opening uncovering the semiconductor layer on the top surface of the bump, and the drain is located on the passivation layer and is in contact with the semiconductor layer through the opening.
7. The pixel structure of claim 6, wherein a material of the drain is different from a material of the source.
8. The pixel structure of claim 6, wherein a material of the drain is the same as a material of the pixel electrode.
9. The pixel structure of claim 1, wherein
   the semiconductor layer covers the drain located on the top surface of the bump and the source located on the at least one of the side surfaces of the bump,
   the gate insulation layer covers the semiconductor layer, and
   the gate covers the gate insulation layer.
10. A fabricating method of a pixel structure, comprising:
    forming a bump on a substrate, the bump having a top surface and a plurality of side surfaces located in periphery of the top surface;
    forming a gate on the bump and forming a scan line on the substrate, wherein the scan line is connected to the gate;
    forming a semiconductor layer on the top surface and the side surfaces of the bump;
    forming a gate insulation layer between the gate and the semiconductor layer;
    forming a conductive layer on the bump;
    forming a patterned photoresist layer on the conductive layer, wherein a thickness of the patterned photoresist layer is less than a height of the bump;
    patterning the conductive layer with use of the patterned photoresist layer as an etching mask, so as to form a drain on the top surface of the bump, wherein the drain does not cover the semiconductor layer located on a corner section of the bump between the top surface and the side surfaces;
    forming a source and a data line connected to the source in periphery of the bump and on the substrate, the source partially covering the side surfaces of the bump; and
    forming a pixel electrode electrically connected to the drain.

11. The fabricating method of claim 10, wherein the gate insulation layer covers the gate and the scan line, the semiconductor layer is located on the gate insulation layer on the top surface and the side surfaces of the bump, and the source and the drain cover the semiconductor layer.

12. The fabricating method of claim 11, further comprising forming a passivation layer covering the drain and the source, wherein the passivation layer has a contact opening, and the pixel electrode is located on the passivation layer and electrically connected to the drain through the contact opening.

13. The fabricating method of claim 11, further comprising forming a passivation layer to cover the source after forming the source, wherein the passivation layer has an opening exposing the semiconductor layer on the top surface of the bump, and the drain is located on the passivation layer and is in contact with the semiconductor layer through the opening.

14. The fabricating method of claim 13, further comprising forming a common electrode line, the drain and the common electrode line being simultaneously defined.

15. The pixel structure of claim 13, wherein the drain and the pixel electrode are simultaneously defined.

16. The fabricating method of claim 13, further comprising forming an insulation layer to cover the drain, wherein the insulation layer has a contact opening, and the pixel electrode is located on the insulation layer and electrically connected to the drain through the contact opening.

17. The fabricating method of claim 10, wherein the semiconductor layer and the source are formed with use of one photomask.

18. The fabricating method of claim 10, wherein the semiconductor layer is located on the source and the drain, the gate insulation layer covers the semiconductor layer, and the gate covers the gate insulation layer.

19. The fabricating method of claim 18, further comprising forming a passivation layer covering the gate, the pixel electrode being formed on the passivation layer, wherein the passivation layer has a contact opening, and the pixel electrode is located on the passivation layer and electrically connected to the drain through the contact opening.

20. The fabricating method of claim 10, wherein a method of forming the patterned photoresist layer on the conductive layer comprises:
    performing a process of coating the substrate with a photoresist material, the photoresist material located on the top surface of the bump being separated from the photoresist material on the side surfaces of the bump because a thickness of the photoresist material is less than the height of the bump; and
    performing a curing step to cure the photoresist material and form the patterned photoresist layer.

* * * * *